(12) United States Patent
Pelrine et al.

(10) Patent No.: US 7,567,681 B2
(45) Date of Patent: Jul. 28, 2009

(54) SURFACE DEFORMATION ELECTROACTIVE POLYMER TRANSDUCERS

(75) Inventors: Ronald E. Pelrine, Louisville, CO (US); Roy D. Kornbluh, Palo Alto, CA (US); Harsha Prahlad, Cupertino, CA (US)

(73) Assignee: SRI International, Menlo Park, CA (US)

( * ) Notice: Subject to any disclaimer, the term of this patent is extended or adjusted under 35 U.S.C. 154(b) by 830 days.

(21) Appl. No.: 10/933,113

(22) Filed: Sep. 1, 2004

(65) Prior Publication Data

US 2005/0157893 A1 Jul. 21, 2005

Related U.S. Application Data

(60) Provisional application No. 60/500,148, filed on Sep. 3, 2003.

(51) Int. Cl.
 *H04R 25/00* (2006.01)
(52) U.S. Cl. ........................ 381/191; 381/176; 381/431
(58) Field of Classification Search ......... 381/170–176, 381/369, 399, 152, 191, 431
See application file for complete search history.

(56) References Cited

U.S. PATENT DOCUMENTS

| | | | |
|---|---|---|---|
| 4,342,936 A | 8/1982 | Marcus et al. | |
| 4,400,634 A | 8/1983 | Micheron | |
| 4,843,275 A | 6/1989 | Radice | |
| 4,885,783 A | 12/1989 | Whitehead et al. | |
| 5,452,878 A | 9/1995 | Gravesen et al. | |
| 5,977,685 A | 11/1999 | Kurita et al. | |
| 6,048,622 A | 4/2000 | Hagood, IV et al. | |
| 6,060,811 A | 5/2000 | Fox et al. | |
| 6,249,076 B1 | 6/2001 | Madden et al. | |
| 6,343,129 B1 | 1/2002 | Pelrine | |
| 6,545,384 B1 | 4/2003 | Pelrine et al. | |
| 6,628,040 B2 * | 9/2003 | Pelrine et al. | ............... 310/307 |
| 6,664,718 B2 | 12/2003 | Pelrine et al. | |

(Continued)

FOREIGN PATENT DOCUMENTS

JP  2001-286162  10/2001

(Continued)

OTHER PUBLICATIONS

Ajluni, C., "Pressure Sensors Strive to Stay on Top, New Silicon Micromachining Techniques and Designs Promise Higher Performance", *Electronic Design—Advanced Technology Series*, Oct. 3, 1994, pp. 67-74.

(Continued)

*Primary Examiner*—Suhan Ni
(74) *Attorney, Agent, or Firm*—Levine Bagade Han LLP

(57) ABSTRACT

The present invention provides electroactive polymer transducers that produce out-of-plane deflections. The transducers form a set of surface features based on deflection of an electroactive polymer. The set of surface features may include elevated polymer surface features and/or depressed electrode surface features. Actuation of an active area may produce the polymer deflection that creates one or more surface features. A passive layer may operably connect to a polymer. The passive layer may comprise a thicker and softer material to amplify polymer thickness changes and increase surface feature visibility.

55 Claims, 12 Drawing Sheets

U.S. PATENT DOCUMENTS

| | | |
|---|---|---|
| 6,768,246 B2 | 7/2004 | Pelrine et al. |
| 6,781,284 B1 | 8/2004 | Pelrine et al. |
| 6,809,462 B2 | 10/2004 | Pelrine et al. |
| 6,812,624 B1 | 11/2004 | Pei et al. |
| 6,882,086 B2 | 4/2005 | Kornbluh et al. |
| 6,911,764 B2 | 6/2005 | Pelrine et al. |
| 2002/0013545 A1 | 1/2002 | Soltanpour et al. |

FOREIGN PATENT DOCUMENTS

| | | |
|---|---|---|
| WO | WO 99/37921 | 7/1999 |
| WO | WO 01/06575 | 1/2001 |
| WO | WO 01/06579 | 1/2001 |
| WO | 02/37660 A1 | 5/2002 |
| WO | 02/37892 A2 | 5/2002 |
| WO | 03/056274 A1 | 7/2003 |
| WO | 03/056287 A1 | 7/2003 |
| WO | 2004/027970 A1 | 4/2004 |
| WO | 2004/053782 A1 | 6/2004 |
| WO | 2004/074797 A1 | 9/2004 |
| WO | 2004/09363 A1 | 11/2004 |

OTHER PUBLICATIONS

Ashley, S., "Artificial Muscles", Scientific American 2003, pp. 53-59.

Bar-Cohen, Y., *WorldWide ElectroActive Polymers, EAP (Artificial Muscles) Newsletter*, vol. 1, No. 1, Jun. 1999.

Bharti, V. et al., "Polarization and Structural Properties of High Energy Electron Irradiated Poly(vinylidene fluoride-trifluoroethylene) Copolymer Films," to be published in J. Appl. Phys. (2000).

Calvert, P. et al., "Electrically stimulated bilayer hydrogels as muscles," Proceedings of the SPIE International Symposium on Smart Structures and Materials: Electro-Active Polymer Actuators and Devices, Mar. 1-2, 1999, Newport Beach, California, USA, pp. 236-241.

Cheng, Z. et al., "Transverse Strain Responses In The Electrostrictive Poly(Vinylidene Fluoride- Trifluorethylene) Copolymer," *Appl. Phys. Lett.* vol. 74, No. 13, pp. 1901-1903, Mar. 29, 1999.

Elhami, K. et al., "Electrostriction Of The Copolymer Of Vinylidene-Fluoride And Trifluoroethylene," *J. Appl. Phys*. vol. 77 (8), pp. 3987-3990, Apr. 15, 1995.

Kornbluh, R. et al., "Artificial Muscle: The Next Generation of Robotic Actuators," presented at the Fourth World Conference on Robotics Research, SME Paper M591-331, Pittsburgh, PA, Sep. 17-19, 1991.

Kornbluh, R. et al. "Elastomeric Dielectric Artificial Muscle Actuators for Small Robots," *Proceedings of the Third IASTED International Conference on Robotics and Manufacturing*, Jun. 14-16, 1995, Cancun, Mexico.

Kornbluh, R. et al., "Electrostrictive Polymer Artificial Muscle Actuators", IEEE International Conference on Robotics and Automation, Leuven, Belgium, 1998.

Kornbluh, R. et al., "High-Field Electrostriction Of Elastomeric Polymer Dielectrics For Actuation", Proceedings of the SPIE International Symposium on Smart Structures and Materials: Electro-Active Polymer Actuators and Devices, Mar. 1-2, 1999, Newport Beach, California, USA. pp. 149-161.

Kornbluh, R. et al., "Electroactive Polymer (EAP) Actuators as Artificial Muscles—Reality, Potential and Challenges", Chapter 16, available from SPIE Press May 2001.

Kornbluh, R. et al., "Ultrahigh Strain Response of Field-Actuated Elastomeric Polymers," Proceedings of the $7^{th}$ SPIE Symposium on Smart Structures and Materials-Electroactive Polymers and Devices (EAPAD) Conference, Mar. 6-8, 2000, Newport Beach, California, USA, pp. 51-64.

Ktech's PVDF Sensors, http://www.ktech.com/pvdf.htm, Jun. 6, 2001, pp. 1-5.

Lakes, R., "Extreme Damping in Compliant Composites with a Negative Stiffness Phase", Philosophical Magazine Letters, 81 pp. 95-100 (2001).

Lakes, R., "Extreme Damping in Composite materials with a Negative Stiffness Phase", Physical Review Letters 86, pp. 2897-2900, Mar. 26, 2001.

Lakes, R. et al., "Extreme Damping in Composite Materials with Negative Stiffness Inclusions", Nature, 410, pp. 565-567 Mar. 2001.

Liu, C. et al., "Electro-statically Stricted Polymers (ESSP)," Proceedings of the SPIE International Symposium on Smart Structures and Materials: Electro-Active Polymer Actuators and Devices, Mar. 1-2, 1999, Newport Beach, California, USA., pp. 186-190.

Ohara, K. et al., "Electrostriction of Polymethylmethacrylates," *Colloid & Polymer Sci*. vol. 280, pp. 164-168 (1982).

Pei, Q., "Description of Conference Demonstration", Mar. 2001.

Pei, Q., et al., "Multifunctional Electroelastomers: Electroactive Polymers Combining Structural, Actuating, and Sensing Functions", IT AD-433-PA-00-123, available at www.sri.com-publications, Jan. 17, 2001.

Pei, Q. et al., "Recent Progress on Electroelastomer Artificial Muscles and Their Application for Biomimetic Robots", SPIE, pub. Jun. 2004, 11 pages.

Pelrine, R. et al., "Electrostriction of Polymer Films for Microactuators," *Proc. IEEE Tenth Annual International Workshop on Micro Electro Mechanical Systems*, Nagoya, Japan, Jan. 26-30, 1997, pp. 238-243.

Pelrine, R. et al., FY 1996 *Final Report on Artificial Muscle for Small Robots*, ITAD-7228-FR-97-058, SRI International, Menlo Park, California, 1997.

Pelrine, R. et al., "High Speed Electrically Actuated Elastomers with Over 100% Strain," *Science*, vol. 287, No. 5454, pp. 1-21, 2000.

Pelrine, R. et al., "Review of Artificial Muscle Approaches," invited paper, in *Proc. Third International Symposium on Micro Machine and Human Science*, Nagoya, Japan, Oct. 14-16, 1992.

Pelrine, R. et al., "High Strain Actuator Materials Based on Dielectric Elastomers," submitted to *Advanced Materials* (May 2000).

Sakarya, S., "Micromachining Techniques for Fabrication of Integrated Light Modulating Devices", Netherlands 2003, pp. 1-133.

Smela, E. et al., "Controlled Folding of Micrometer-size Structures," *Science*, vol. 268, pp. 1735-1738 (Jun. 23, 1995).

Treloar, L., "Mechanics of Rubber Elasticity," *J Polymer Science, Polymer Symposium*, No. 48, pp. 107-123, 1974.

U.S. Appl. No. 09/619,848, entitled "Electroactive Polymer Generators", by inventor(s) Pelrine, filed Jul. 20, 2000.

Pelrine, R. et al., "Recent Progress in Artificial Muscle Micro Actuators," SRI International, Tokyo, 1999 MITI/NEEDOIMNIC, 1999.

Uchino, K., "Electrostrictive Actuators: Materials and Applications," *Ceramic Bulletin*, 65(4), pp. 647-652, 1986.

Winters, J., "Muscle as an Actuator for Intelligent Robots", Robotics Research: Trans. Robotics International of SME, Scottsdale, AZ (Aug. 18-21, 1986).

Kornbluh, R., Robotic Systems, Ocean Engineering and Marine Systems 1997 Program, Dec. 1997, Office of Naval Research Public Release, ONR 32198-2.

Zhenyi, M. et al., "High Field Electrostrictive Response of Polymers," *Journal of Polymer Sciences, Part B-Polymer Physics*, vol. 32, pp. 2721-2731, 1994.

Kornbluh et al., "Electroactive Polymers: An emerging technology for MEMS," SRI International, Menlo Park, CA, SPIE, V.5344, 2004.

Kornbluh et al., "Medical Applications of New Electroactive Polymer Artificial Muscles," SRI International, Menlo Park, CA, JSPP, V.16 2004.

Australian Office Action dated Nov. 3, 2008 from Australian Application No. 2004315868.

Puers et al, "A Capacitive Pressure Sensor with Low Impedance Output and Active Suppression of Parasitic Effects," Sensors and Actuators, A21-A23 (1990) 108-114.

Robert Puers, "Capacitive sensors: when and how to use them," Sensors and Actuators A, 37-38 (1993) 93-105.

* cited by examiner

SURFACE DEFORMATION ELECTROACTIVE POLYMER TRANSDUCERS

CROSS-REFERENCE TO RELATED APPLICATIONS

This application claims priority under 35 U.S.C. §119(e) from co-pending U.S. Provisional Patent Application No. 60/500,148 filed Sep. 3, 2003, naming R. Pelrine et al. as inventors, and titled "Shear Mode EPAM", which is incorporated by reference herein for all purposes.

U.S. GOVERNMENT RIGHTS

This application was made in part with government support under contract number MDA972-02-C-0001 awarded by the United States Defense Advanced Research Project Agency. The government has certain rights in the invention.

BACKGROUND OF THE INVENTION

The present invention relates generally to electroactive polymers that convert between electrical energy and mechanical energy. More particularly, the present invention relates to electroactive polymers and their abilities and applications related to surface deformation, surface texturing and surface geometry control.

In many applications, it is desirable to convert between electrical energy and mechanical energy. Common technologies that convert electrical energy to mechanical work include motors and piezoelectric ceramics for example. Most conventional electrical to mechanical technologies provide limited mechanical output abilities. Motors provide continuous rotary output—and generally require additional and bulky coupling to provide discontinuous output or low-frequency motion. Piezoelectric ceramics are typically limited to in-plane strains between the rigid electrodes below about 1.6 percent and are not suitable for applications requiring greater strains or out-of plane deformations.

New high-performance polymers capable of converting electrical energy to mechanical energy, and vice versa, are now available for a wide range of energy conversion applications. One class of these polymers, electroactive elastomers (also called dielectric elastomers, electroelastomers, or EPAM (Electroactive Polymer Artificial Muscle)), is gaining wider attention. Electroactive elastomers may exhibit high energy density, stress, and electromechanical coupling efficiency. To date, electroactive polymer transducers and devices have been directed towards in-plane strains for conversion between electrical and mechanical energy.

Many applications demand a light-weight, scaleable device that converts between electrical and mechanical energy in out-of plane directions.

SUMMARY OF THE INVENTION

The present invention provides electroactive polymer transducers that produce out-of-plane deflections. The transducers form a set of surface features based on deflection of an electroactive polymer. The set of surface features may include elevated polymer surface features and/or depressed electrode surface features. Actuation of an active area may produce the polymer deflection that creates one or more surface features. In one embodiment, a passive layer operably connects to a polymer and augments out-of-plane deflections. The passive layer may comprise a thicker and softer material to amplify thickness changes and increase surface feature visibility.

In one aspect, the present invention relates to an electroactive polymer transducer. The transducer comprises an electroactive polymer including an undeflected thickness for a surface region on a first surface of the polymer. The transducer also comprises a first electrode disposed on a portion of the first surface of the electroactive polymer. The transducer further comprises a second electrode disposed on a portion of a second surface of the electroactive polymer. The electroactive polymer is configured to include a polymer surface feature above the undeflected thickness after deflection of an active area. The first electrode is configured to include an electrode surface feature below the undeflected thickness after deflection of the active area In another aspect, the present invention relates to an electroactive polymer transducer. The transducer comprises an electroactive polymer including an undeflected thickness for a surface region on a first surface of the polymer. The transducer also comprises a first electrode disposed on the first surface of the electroactive polymer and a second electrode disposed on a second surface of the electroactive polymer. The electroactive polymer and first electrode are configured to produce a set of surface features on the first surface after deflection of an active area. The set of features includes a) a polymer surface feature that is elevated above the undeflected thickness and outside the first electrode on the first surface or b) an electrode surface feature that is depressed below the undeflected thickness.

In yet another aspect, the present invention relates to an electroactive polymer transducer. The transducer comprises an electroactive polymer including an undeflected thickness for a surface region on a first surface of the polymer. The transducer also comprises a first electrode disposed on a portion of the first surface of the electroactive polymer. The transducer further comprises a second electrode disposed on a portion of a second surface of the electroactive polymer. The electroactive polymer and first electrode are configured to produce a set of surface features on the first surface after deflection of an active area. The set of surface features includes a polymer surface feature above the undeflected thickness on the first surface or an electrode surface feature below the undeflected thickness. The transducer additionally comprises a passive layer that neighbors the first surface and is configured to deflect with the deflection of the electroactive polymer such that a surface of the passive layer opposite to the electroactive polymer forms a set of passive layer surface features that resembles the set of surface features on the first surface In still another aspect, the present invention relates to a method of actuating an electroactive polymer transducer. The method comprises actuating a first portion of the electroactive polymer including an undeflected thickness for a first surface region on a first surface of the polymer before actuation of the first portion to create a first surface feature on the first surface. The method also comprises actuating a second portion of the electroactive polymer including an undeflected thickness for a second surface region on the first surface of the polymer before actuation of the second portion to create a second surface feature on the first surface.

These and other features and advantages of the present invention will be described in the following description of the invention and associated figures.

DETAILED DESCRIPTION OF THE PREFERRED EMBODIMENTS

The present invention is described in detail with reference to a few preferred embodiments as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

1. General Structure of Electroactive Polymers

The transformation between electrical and mechanical energy in transducers and devices of the present invention is based on elasticity of an electroactive polymer and energy conversion of one or more portions of an electroactive polymer (EAP).

Figure 1A:
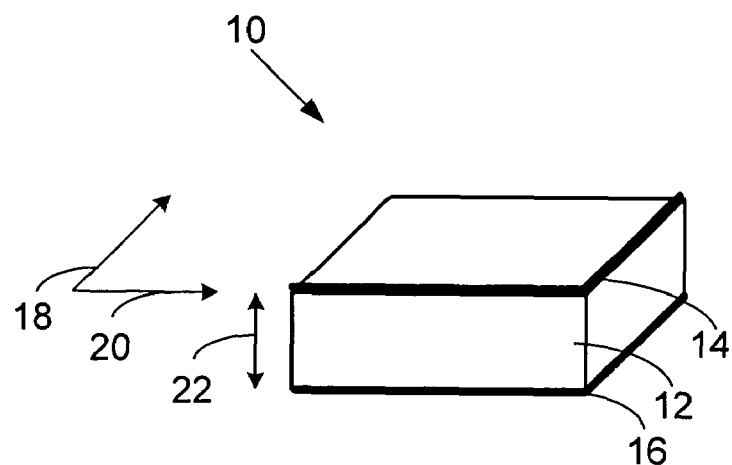
FIGS. 1A and 1B illustrate a top perspective view of a transducer before and after application of a voltage in accordance with one embodiment of the present invention.

To help illustrate the performance of an electroactive polymer in converting electrical energy to mechanical energy, FIG. 1A illustrates a top perspective view of a transducer portion 10 in accordance with one embodiment of the present invention. While electroactive polymer transducers will now be described as structures, those skilled in the area will recognize that the present invention encompasses a methods for performing the actions as described below.

The transducer portion 10 comprises an electroactive polymer 12 for converting between electrical energy and mechanical energy. In one embodiment, an electroactive polymer refers to a polymer that acts as an insulating dielectric between two electrodes and may deflect upon application of a voltage difference between the two electrodes. Top and bottom electrodes 14 and 16 attach to electroactive polymer 12 on its top and bottom surfaces, respectively, to provide a voltage difference across a portion of the polymer 12. Polymer 12 deflects with a change in electric field provided by the top and bottom electrodes 14 and 16. Deflection of the transducer portion 10 in response to a change in electric field provided by the electrodes 14 and 16 is referred to as actuation.

Figure 1B:
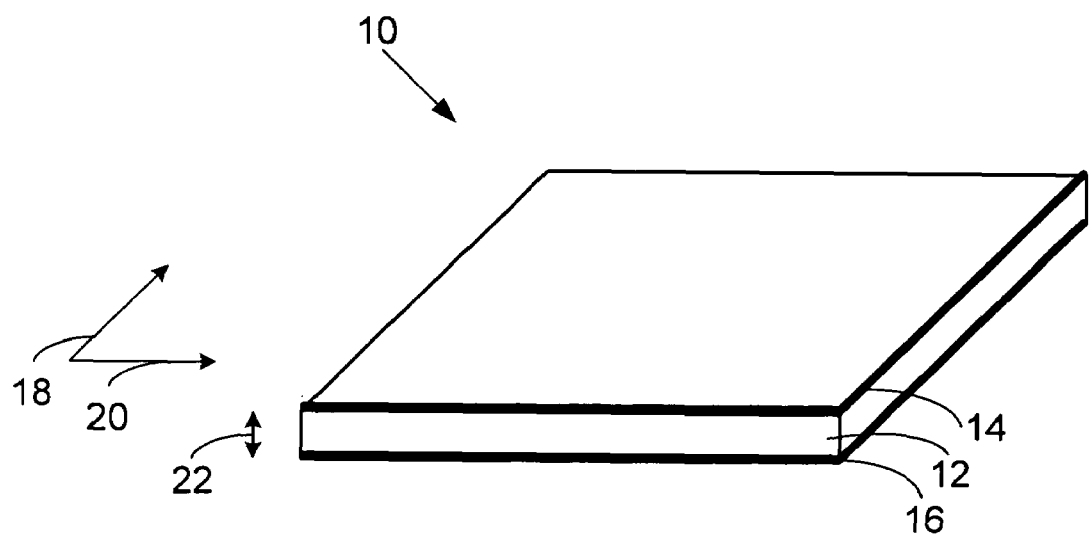

FIG. 1B illustrates a top perspective view of the transducer portion 10 including deflection in response to a change in electric field. In general, deflection refers to any displacement, expansion, contraction, bulging, torsion, linear or area strain, or any other deformation of a portion of the polymer 12. The change in electric field corresponding to the voltage difference applied to or by the electrodes 14 and 16 produces mechanical pressure within polymer 12. In this case, the unlike electrical charges produced by electrodes 14 and 16 attract each other and provide a compressive force between electrodes 14 and 16 and an expansion force on polymer 12 in planar directions 18 and 20, causing polymer 12 to compress between electrodes 14 and 16 and stretch in the planar directions 18 and 20.

After application of the voltage between electrodes 14 and 16, polymer 12 expands (stretches) in both planar directions 18 and 20. In some cases, polymer 12 is incompressible, e.g. has a substantially constant volume under stress. For an incompressible polymer 12, polymer 12 decreases in thickness as a result of the expansion in the planar directions 18 and 20. It should be noted that the present invention is not limited to incompressible polymers and deflection of the polymer 12 may not conform to such a simple relationship.

Application of a relatively large voltage difference between electrodes 14 and 16 on the transducer portion 10 shown in FIG. 1A thus causes transducer portion 10 to change to a thinner, larger area shape as shown in FIG. 1B. In this manner, the transducer portion 10 converts electrical energy to mechanical energy.

As shown in FIGS. 1A and 1B, electrodes 14 and 16 cover the entire portion of polymer 12 as shown. More commonly, electrodes 14 and 16 cover a limited portion of polymer 12 relative to the total surface area of the polymer. For the present invention, this is done to utilize incompressibility of the polymer and produce surface features and deformations on one or more of the polymer surfaces. This may also be done to prevent electrical breakdown around the edge of polymer 12. Electrodes may also be patterned with special shapes to achieve customized surface deflections, as will be described in further detail below.

As the term is used herein, an active area refers to a portion of a transducer comprising polymer material 12 and at least two electrodes. When the active area is used to convert electrical energy to mechanical energy, the active area includes a portion of polymer 12 having sufficient electrostatic force to enable deflection of the portion. When the active area is used to convert mechanical energy to electrical energy, the active area includes a portion of polymer 12 having sufficient deflection to enable a change in electrostatic energy. As will be described below, a polymer of the present invention may have multiple active areas.

Figure 1C:
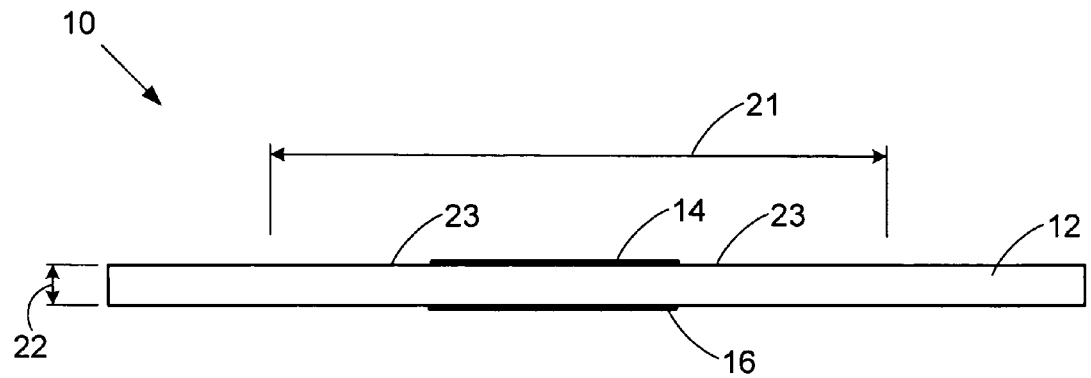
FIG. 1C illustrates a side view of transducer including a surface region before actuation in accordance with one embodiment of the present invention.

FIG. 1C illustrates an extended side view of a transducer 10 outside the portion shown in FIG. 1A and including a surface region 21 before actuation in accordance with one embodiment of the present invention. As the term is used herein, a surface region 21 generally refers to a surface portion of interest for an electroactive polymer transducer that includes at least a part of the polymer surface covered by an electrode (or electrode portion) and polymer surface outside the electrode (or portion) that is affected by deflection of an active area including the electrode (or portion). For the planar polymer 12 and rectangular electrode 14 of FIG. 1C, surface region 21 comprises the surface area of polymer 12 covered by electrode 14 and neighboring surface portions 23 of polymer 12 perimetrically surrounding electrode 14 on the top surface of polymer 12. In one embodiment, surface region 21 comprises all surface portions of an electroactive polymer transducer affected by elastic and electrostatic forces resulting from actuation of an active area of polymer 12, including polymer and electrode material surface portions of a driven active area and polymer and electrode material surface portions proximate to the driven active area.

Before actuation, transducer 10 can be described by an undeflected thickness 22 over surface region 21. The undeflected thickness 22 refers to the approximate thickness of polymer 12 before deflection to produce a surface feature. Thickness 22 may be measured from one surface of polymer 12 to the other surface of polymer 12 over the surface region 21. Typically, polymer 12 is relatively flat on both its top and bottom surfaces and has a relatively constant thickness 22 across the polymer surface and surface region 21. Electrodes 14 and 16 often include a minimal or negligible depth and add little to thickness 22 and in these cases undeflected thickness 22 may include electrodes 14 and 16. The undeflected thickness 22 thus corresponds to the thickness of the polymer in cross section. For commercially available polymers, the undeflected thickness 22 may roughly correspond to the thickness of the polymer as manufactured and received. In one embodiment, polymer 12 is pre-strained, as will be described in further detail below, and thickness 22 refers to the undeflected thickness in surface region 21 after pre-straining. It is understood that the thickness of polymer 12 and electrodes 14 and 16 between top and bottom surfaces over the surface region 21 may vary slightly, say by 1-20 percent in some cases. Here, undeflected thickness 22 may refer to an average or arithmetic representation of the varying thicknesses across surface region 21. It is understood that some polymers may not include perfectly consistent thicknesses and that an undeflected thickness for a surface region 21 may better describe the thickness of surface region 21 before actuation. In one embodiment, transducer 10 is substantially flat before deflection. In another embodiment, transducer 10 is configured on a curved surface and with a generally consistent thickness for the polymer on the curved surface. While deflection as described herein will mainly be described via an actuation using electrodes 14 and 16, it is understood that generation and sensing functions as described below may also lead to deflections and surface features.

Figure 1D:
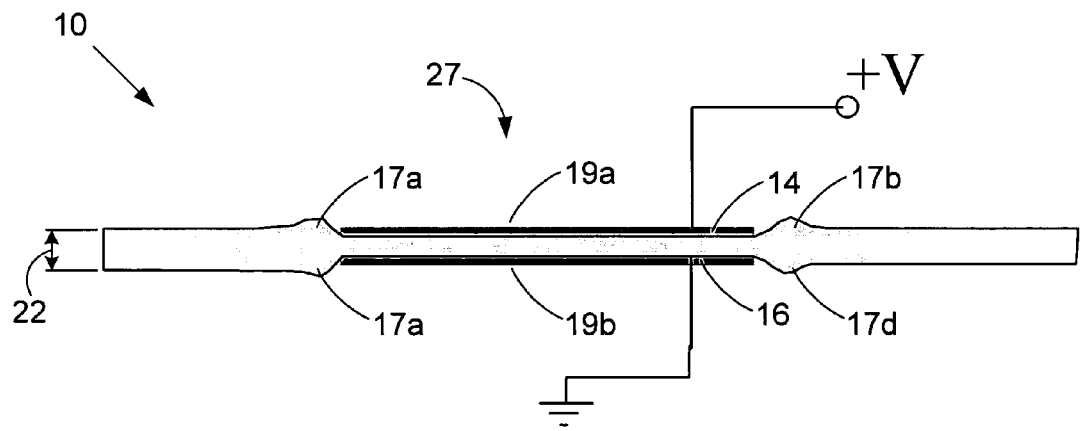
FIG. 1D illustrates a side view of transducer including surface region after actuation in accordance with one embodiment of the present invention.

FIG. 1D illustrates a side view of transducer 10 including surface region 21, after deflection of an active area, in accordance with one embodiment of the present invention. Polymer 12 material outside an active area typically resists active area deflection. While the amount of resistance may vary based on how the entire polymer is held or configured by a frame for example, polymer 12 material outside an active area commonly acts as a spring force, based on elasticity of the material. Since the polymer 12 material is compliant, the material may deform and bulges out-of-plane in the thickness direction (orthogonal to the plane) in response to deflection or actuation of an active area.

The polymer 12 and one or both electrodes 14 and 16 of transducer 10 are configured to produce polymer surface features 17*a-b* form on the top surface of polymer 12 above the undeflected thickness 22 after deformation of the active area. The polymer surface features 17 refer to portions of an electroactive polymer elevated above the undeflected thickness 22 as a result of deflection, electrostatic forces and/or elastic response in the polymer. In this case, elevated surface features 17*a-b* are created around the edges of an active area corresponding to the surface shape of electrode 14 (and to a lesser extent, electrode 16 on the opposite surface). The surface features 17*a-b* may be distinct bulges as shown in FIG. 1D, or they may be more distributed increases in thickness outside the electrode region 14, depending on the films tension and elasticity. Similarly, bottom polymer surface features 17*c-d* are formed on the bottom side of polymer 12 around the edges of an active area corresponding to the surface shape of electrode 16 (and to a lesser extent, electrode 14). The polymer surface features 17 generally result from the fact that while the actuated polymer 12 increases in surface area over an active area proximate to electrodes 14 and 16, the polymer often (depending on design) decreases in area over the inactive regions of the polymer. The bulging polymer surface features 17 then include displaced polymer material, typically located at the edges of an electrode for an active area. Surface region 21 for the top surface of transducer 10 in this case then includes the planar area of electrode 14 and polymer surface features 17*a-b*.

In addition to the elevated polymer surface features 17, polymer 12 and one or both electrodes 14 and 16 of transducer 10 are configured to produce a lowered electrode portion 27 that rests below the undeflected thickness 22 after the deflection due to actuation. In this case, all of electrode 14 on the top surface is depressed below the undeflected thickness 22 after deflection. The depressed electrode portion 27 also acts as an electrode surface feature 19*a* created by actuation and deflection of polymer 12 and thinning of polymer 12 around electrodes 14 and 16. For example, if electrode 14 is shaped as a circle, then the electrode surface feature 19*a* will be a depressed circle when viewed from the top, while polymer surface feature 17 will comprise an elevated 'O' or ring about the depressed circle. As will be described in greater detail below, electrodes 14 and 16 can be patterned or designed to produce customized polymer surface features 17 and electrode surface features 19, such as letters (e.g., a, n, y, l, e, t, r) or more complex patterns and shapes.

Bottom electrode 16 similarly expands in the plane and thins to create an electrode surface feature 19*b* on the bottom side of transducer 10. Electrode surface feature 19b rests below the undeflected thickness 22 for the bottom side of transducer 10. Elastic resistance in polymer 12 to expansion of polymer 12 in an active area between electrodes 14 and 16 also creates polymer surface features 17c-d on the bottom side of transducer 10.

While out-of-plane surface features 17 are shown relatively local to the active area, the out-of-plane is not always localized as shown. In some cases, if the polymer is pre-strained, then the surface features 17a-b are stretched or smoothed out over the inactive polymer material. The magnitude of out-of-plane deformation may vary with the exact geometry, pre-strain, etc. However, regardless of whether it is described as a local bulge or distributed, the inactive regions generally become thicker in cross section.

In general, the transducer 10 (polymer 12 and electrodes) continues to deflect until mechanical forces balance the electrostatic forces driving the deflection. More specifically, polymer 12 between electrodes 14 and 16 and in the active area continues to expand and thin, while polymer surface features 17 continue to elevate from the surfaces of polymer 12 and electrode surface feature 19 continue to form by the thinning of polymer 12, until mechanical forces balance the electrostatic forces driving the deflection. The mechanical forces include elastic restoring forces of the polymer 12 material inside and outside the active area, the compliance of electrodes 14 and 16, and any external resistance provided by a device and/or load coupled to the transducer portion 10, etc. The deflection of the transducer portion 10 as a result of the applied voltage may also depend on a number of other factors such as the polymer 12 dielectric constant and the size of polymer 12.

Figure 1E:
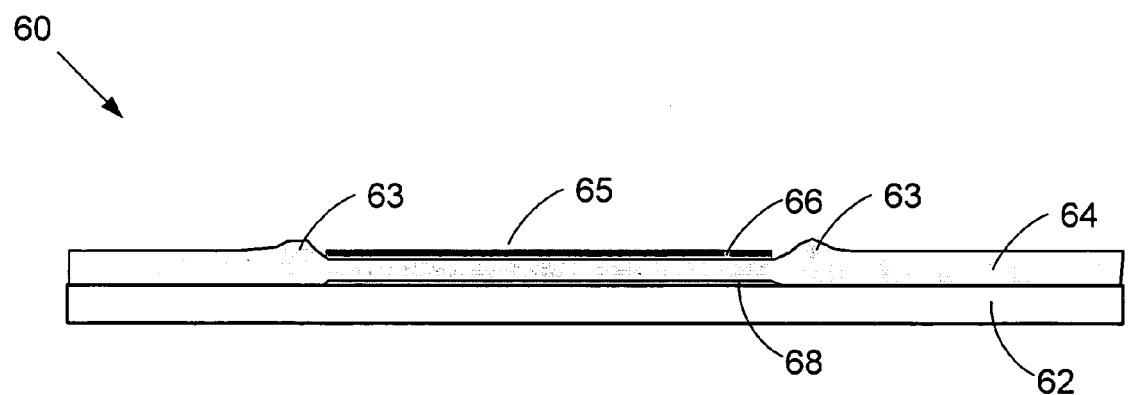
FIG. 1E illustrates a transducer comprising a rigid layer in accordance with one embodiment of the present invention.

FIG. 1E illustrates a transducer 60 comprising a rigid layer 62 in accordance with one embodiment of the present invention. Transducer 60 comprises rigid layer 62, electroactive polymer 64, top surface electrode 66, bottom surface electrode 68, polymer surface features 63 and electrode surface features 65.

Rigid layer 62 attaches to a bottom surface of polymer 64 and prevents the bottom surface of polymer 64 from deflecting. As a result, only the top surface of polymer 64 includes polymer surface features 63 and electrode surface feature 65.

Rigid layer 62 may comprise a rigid structure such as a stiff metal or non-metal plate, for example. In one embodiment, rigid layer 62 comprises a non-compliant electrode material such as a suitably stiff metal, which then doubly acts as an electrode for the surface it attaches to and a rigid layer 62. The rigid layer 62 electrode may be any type of conductive material. For instance, the rigid layer 62 electrode may be a metal, such as copper, aluminum, gold, silver, etc. In another specific embodiment, the rigid layer 62 electrode may comprise a conductive ceramic-based composite material.

Polymer 64 may be bonded to rigid layer 62 using a bonding agent. Partially bonding between polymer 64 and the structure, i.e. the area of the bonding agent is less than the area of contact between polymer 64 and rigid layer 62, permits customized deflections of polymer 64. For example, for a rectangular polymer 64 and rigid layer 62, polymer 64 may be bonded to rigid layer 62 along two edges of the rectangle. In this case, polymer 64 expands relative to rigid layer 62 in the un-bonded direction. During expansion of polymer 64, a lubricant may be disposed between rigid layer 62 and polymer 64 to reduce friction between the two surfaces. An optional passive layer may also be disposed between rigid layer 62 and polymer 64. The passive layer is selected so that it deflects as polymer 64 deflects. This specific embodiment allows polymer 64 to expand more as compared to when it is directly bonded to rigid layer 62.

Generally, polymers that are suitable for use with transducers of this invention include any substantially insulating polymer or rubber (or combination thereof) that deforms in response to an electrostatic force or whose deformation results in a change in electric field. Preferably, the polymer's deformation is reversible over a wide range of strains. Many elastomeric polymers may serve this purpose. In designing or choosing an appropriate polymer, one should consider the optimal material, physical, and chemical properties. Such properties can be tailored by judicious selection of monomer (including any side chains), additives, degree of cross-linking, crystallinity, molecular weight, etc.

Polymer 12 may assume many different physical and chemical states. For example, the polymer may be used with or without additives such as plasticizers. And they may be monolithic polymeric sheets or combinations of polymers such as laminates or patchworks. Further, the polymers may exist in a single phase or multiple phases. One example of a multiphase material is a polymeric matrix having inorganic filler particles admixed therewith.

Regardless of the ultimate chemical and physical state of the transducer polymer, it will include a polymer matrix. That matrix may be a homopolymer or copolymer, cross-linked or uncross-linked, linear or branched, etc. Exemplary classes of polymer suitable for use with transducers of this invention include silicone elastomers, acrylic elastomers, polyurethanes, thermoplastic elastomers, copolymers comprising PVDF, pressure-sensitive adhesives, fluoroelastomers, polymers comprising silicone and acrylic moieties, and the like. Obviously, combinations of some of these materials may be used as the polymer matrix in transducers of this invention. Copolymers and blends fall within the class of suitable polymers. One example is a blend of a silicone elastomer and an acrylic elastomer.

One suitable commercially available polymer is NuSil CF19-2186 as provided by NuSil Technology of Carpenteria, Calif. An example of a suitable silicone elastomer is Dow Corning HS3 as provided by Dow Corning of Wilmington, Del. One example of a suitable fluorosilicone is Dow Corning 730 as provided by Dow Corning of Wilmington, Del. Examples of suitable acrylics include any acrylic in the 4900 VHB acrylic series as provided by 3M Corp. of St. Paul, Minn.

Suitable actuation voltages for electroactive polymers, or portions thereof, may vary based on the material properties of the electroactive polymer, such as the dielectric constant, as well as the dimensions of the polymer, such as the thickness of the polymer film. For example, actuation electric fields used to actuate polymer 12 in FIG. 1A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example.

In one embodiment, polymer 12 is compliant and selected based on its elastance. A modulus of elasticity for polymer 12 less than about 100 MPa is suitable for many embodiments. In one specific embodiment, electroactive polymer 12 includes an elastic modulus less than 40 MPa. In another specific embodiment, electroactive polymer 12 is relatively compliant and includes an elastic modulus less than 10 MPa.

In one embodiment, electroactive polymer 12 is pre-strained. The performance of many polymers is notably increased when the polymers are pre-strained in area. For example, a 10-fold to 25-fold increase in area significantly improves performance of many electroactive elastomers. Pre-strain of a polymer may be described, in one or more directions, as the change in dimension in a direction after pre-straining relative to the dimension in that direction before pre-straining. The pre-strain may comprise elastic deformation of polymer 12 and be formed, for example, by stretching the polymer in tension and holding one or more of the edges while stretched. The pre-strain may be imposed at the boundaries using a rigid frame or may also be implemented locally for a portion of the polymer. In another embodiment, portions of the polymer are cured or otherwise stiffened to increase their rigidity and hold pre-strain on a polymer. This allows pre-strain to be held without an external frame. For many polymers, pre-strain improves conversion between electrical and mechanical energy. The improved mechanical response enables greater mechanical work for an electroactive polymer, e.g., larger deflections and actuation pressures. In one embodiment, prestrain improves the dielectric strength of the polymer. In another embodiment, the pre-strain is elastic. After actuation, an elastically pre-strained polymer could, in principle, be unfixed and return to its original state.

In one embodiment, pre-strain is applied uniformly over a portion of polymer 12 to produce an isotropic pre-strained polymer. By way of example, an acrylic elastomeric polymer may be stretched by 200 to 400 percent in both planar directions. In another embodiment, pre-strain is applied unequally in different directions for a portion of polymer 12 to produce an anisotropic pre-strained polymer. In this case, polymer 12 may deflect greater in one direction than another when actuated. While not wishing to be bound by theory, it is believed that pre-straining a polymer in one direction may increase the stiffness of the polymer in the pre-strain direction. Correspondingly, the polymer is relatively stiffer in the high pre-strain direction and more compliant in the low pre-strain direction and, upon actuation, more deflection occurs in the low pre-strain direction. In one embodiment, the deflection in direction 108 of transducer portion 10 can be enhanced by exploiting large pre-strain in the perpendicular direction 110. For example, an acrylic elastomeric polymer used as the transducer portion 10 may be stretched by 10 percent in direction 108 and by 500 percent in the perpendicular direction 110. The quantity of pre-strain for a polymer may be based on the polymer material and the desired performance of the polymer in an application. Pre-strain suitable for use with the present invention is further described in commonly owned, copending U.S. patent application Ser. No. 09/619, 848, which is incorporated by reference for all purposes.

Edges of polymer 12 may be fixed to one or more objects. The polymer may be fixed to the one or more objects according to any conventional method known in the art such as a chemical adhesive, an adhesive layer or material, mechanical attachment, etc. Transducers and polymers of the present invention are not limited to any particular geometry or type of deflection. For example, the polymer and electrodes may be formed into any geometry or shape including tubes and rolls, stretched polymers attached between multiple rigid structures, stretched polymers attached across a frame of any geometry—including curved or complex geometry's, across a frame having one or more joints, etc. Deflection of a transducer according to the present invention includes linear expansion and compression in one or more directions, bending, axial deflection when the polymer is rolled, deflection out of a hole provided in a substrate, etc. Deflection of a transducer may be affected by how the polymer is constrained by a frame or rigid structures attached to the polymer. In one embodiment, a flexible material that is stiffer in elongation than the polymer is attached to one side of a transducer induces bending when the polymer is actuated.

2. Electrodes

As electroactive polymers of the present invention may deflect at high strains, electrodes attached to the polymers should also deflect without compromising mechanical or electrical performance. Generally, electrodes suitable for use with the present invention may be of any shape and material provided that they are able to supply a suitable voltage to, or receive a suitable voltage from, an electroactive polymer. The voltage may be either constant or varying over time. In one embodiment, the electrodes adhere to a surface of the polymer. Electrodes adhering to the polymer may be compliant and conform to the changing shape of the polymer. The electrodes may be only applied to a portion of an electroactive polymer and define an active area according to their geometry. As will be described below, the electrodes may also be patterned to achieve a desired shape for a surface feature created by deflection of the polymer.

In one embodiment, electrodes 14 and 16 are compliant and conform to the shape of an electroactive polymer to which they are attached. Referring back to FIGS. 1A and 1B, the configuration of polymer 12 and electrodes 14 and 16 provides for increasing polymer 12 response with deflection. More specifically, as the transducer portion 10 deflects, compression of polymer 12 brings the opposite charges of electrodes 14 and 16 closer and the stretching of polymer 12 separates similar charges in each electrode. In one embodiment, one of the electrodes 14 and 16 is ground.

Various types of electrodes suitable for use with the present invention are described in commonly owned, copending U.S. patent application Ser. No. 09/619,848, which was previously incorporated by reference above. Electrodes described therein and suitable for use with the present invention include structured electrodes comprising metal traces and charge distribution layers, textured electrodes, conductive greases such as carbon greases or silver greases, colloidal suspensions, high aspect ratio conductive materials such as carbon fibrils and carbon nanotubes, and mixtures of ionically conductive materials.

The present invention may also employ metal and semi-flexible electrodes. In one embodiment, a rigid electrode comprises a metal disposed in a thick layer that is not capable of significant bending or planar stretching. In another embodiment, a semi-flexible electrode comprises a metal disposed in thin sheets such that the metal layer, like tin foil for example, is flexible out-of-plane but relatively rigid in plane. Thus, the polymer may deflect out-of-plane as described above but deflections in plane are limited to elastic strain of the metal sheet. Another flexible out-of-plane but relatively rigid in plane electrode may comprise a sheet of aluminized mylar. In another embodiment, the metal is disposed in thick sheets such that the metal layer is rigid and restrains the polymer from deflection on the attached surface.

Materials used for electrodes of the present invention may vary. Suitable materials used in an electrode may include graphite, carbon black, colloidal suspensions, thin metals including silver and gold, silver filled and carbon filled gels and polymers, gelatin, and ionically or electronically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

It is understood that certain electrode materials may work well with particular polymers and may not work as well for others. For most transducers, desirable properties for the compliant electrode may include one or more of the following: low modulus of elasticity, low mechanical damping, low surface resistivity, uniform resistivity, chemical and environmental stability, chemical compatibility with the electroactive polymer, good adherence to the electroactive polymer, and the ability to form smooth surfaces. In some cases, a transducer of the present invention may implement two different types of electrodes, e.g., a different electrode type for each active area or different electrode types on opposing sides of a polymer.

Electronic drivers are typically connected to the electrodes. The voltage provided to an electroactive polymer will depend upon specifics of an application. In one embodiment, a transducer of the present invention is driven electrically by modulating an applied voltage about a DC bias voltage. Modulation about a bias voltage allows for improved sensitivity and linearity of the transducer to the applied voltage. For example, a transducer used in an audio application may be driven by a signal of up to 200 to 1000 volts peak to peak on top of a bias voltage ranging from about 750 to 2000 volts DC.

Figure 1F:
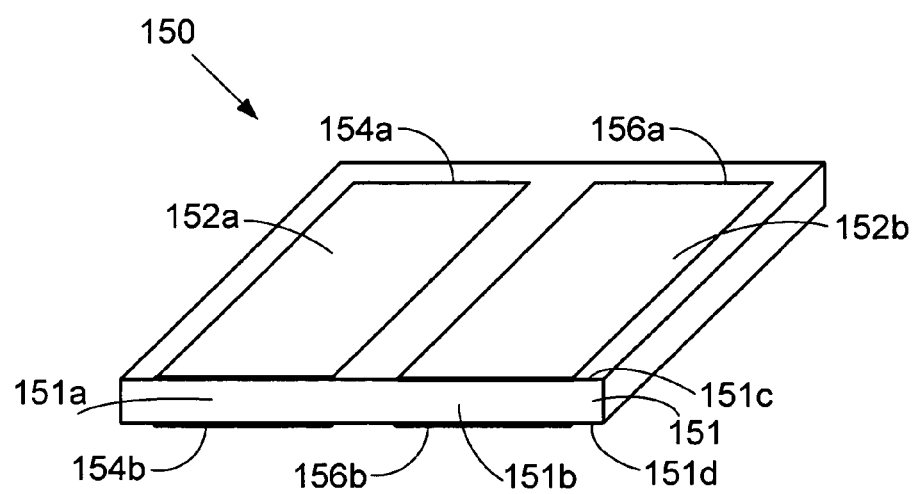
FIG. 1F illustrates a monolithic transducer comprising a plurality of active areas in accordance with one embodiment of the present invention.

In accordance with the present invention, the term "monolithic" is used herein to refer to electroactive polymers, transducers, and devices comprising a plurality of active areas on a single polymer. FIG. 1F illustrates a monolithic transducer 150 comprising a plurality of active areas in accordance with one embodiment of the present invention. The monolithic transducer 150 converts between electrical energy and mechanical energy. The monolithic transducer 150 comprises an electroactive polymer 151 having two active areas 152a and 152b.

Active area 152a has top and bottom electrodes 154a and 154b that are attached to polymer 151 on its top and bottom surfaces 151c and 151d, respectively. The electrodes 154a and 154b provide a voltage difference across a portion 151a of polymer 151. The portion 151a deflects with a change in electric field provided by the electrodes 154a and 154b. More specifically, portion 151a expands in the plane and thins vertically—or orthogonal to the plane—with a suitable voltage difference across a portion 151a. The portion 151a comprises the polymer 151 between the electrodes 154a and 154b and any other portions of the polymer 151 having sufficient stress induced by the electrostatic force to enable deflection and thinning upon application of voltages using the electrodes 154a and 154b.

Active area 152b has top and bottom electrodes 156a and 156b that are attached to the polymer 151 on its top and bottom surfaces 151c and 151d, respectively. The electrodes 156a and 156b provide a voltage difference across a portion 151b of polymer 151. The portion 151b deflects with a change in electric field provided by the electrodes 156a and 156b. More specifically, portion 151a expands in the plane and thins vertically—or orthogonal to the plane—with a suitable voltage difference across a portion 151a. The portion 151b comprises polymer 151 between the electrodes 156a and 156b and any other portions of the polymer 151 having sufficient stress induced by the electrostatic force to enable deflection upon application of voltages using the electrodes 156a and 156b.

Polymer surface features may be formed about the perimeter of top and bottom electrodes 154a and 154b during actuation of each active area 151a. The polymer surface features would include aggregated polymer 151 material that bulges vertically from the plane of polymer 151 on the top and bottom surfaces. When viewed from the top, the top polymer surface feature resembles a rectangle that borders the rectangular dimensions of top electrode 154a. When viewed from the bottom, the bottom polymer surface feature resembles a rectangle that borders the rectangular dimensions of bottom electrode 154b.

Electrode surface features may be formed corresponding to the shape and size of electrodes 154a and 154b during actuation of each active area 151a. In this case, the top and bottom electrode surface features resemble a rectangle with dimensions corresponding to the dimensions of electrodes 154a and 154b when actuated, respectively.

Active areas 152a and 152b permit independent control via their respective electrodes. Thus, in conjunction with suitable control electronics, active areas 152a and 152b may be actuated individually, simultaneously, intermittently, etc. to independently create polymer surface features and electrode surface features for each active area 151.

So far, electrodes on opposite surfaces of an electroactive polymer described so far have been symmetrical in size, shape and location. Electrodes on opposite sides of a transducer of the present invention are not limited to symmetrical designs or layouts and may have different sizes, shapes, types, and/or locations on opposite surfaces of an electroactive polymer. Electrodes on a polymer may be patterned as desired. For example, one or more electrodes may be sprayed onto a surface of a polymer in the shape determined by a stencil. Different stencils may be used for each polymer surface Control of electrodes for each active area then allow each active area to be activated on the polymer surface individually, simultaneously, intermittently, etc. Further description and examples of customized surface features are described below.

Figure 1G:
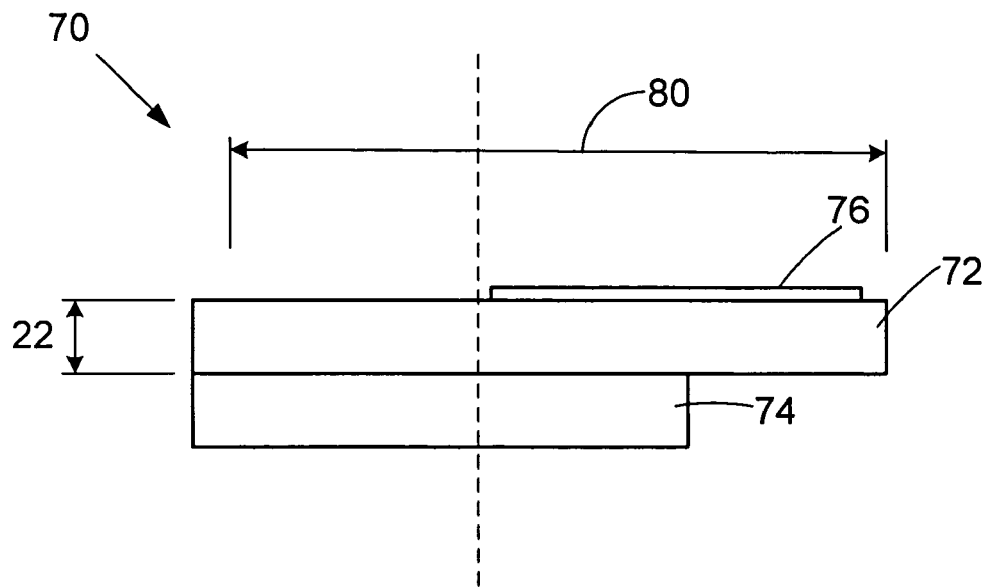
FIG. 1G illustrates an electroactive polymer transducer before deflection in accordance with a specific embodiment of the present invention.

FIG. 1G illustrates an electroactive polymer transducer 70 before deflection in accordance with a specific embodiment of the present invention. Transducer 70 comprises an electroactive polymer 72, electrode 74 and electrode 76. Polymer 72 is characterized by an undeflected thickness 22 before deflection for a surface region 80 of interest. Undeflected thickness 22 for either surface is measured from a surface opposite to the surface of polymer 72 being deformed, before deflection. Electrode 74 adheres to a bottom surface of polymer 72, comprises a metal, and is thick and rigid. Electrode 76 adheres to a top surface of polymer 72, comprises a compliant electrode and conforms in shape to polymer 72. Electrode 76 also includes a different size, lateral location and shape than electrode 74.

Figure 1H:
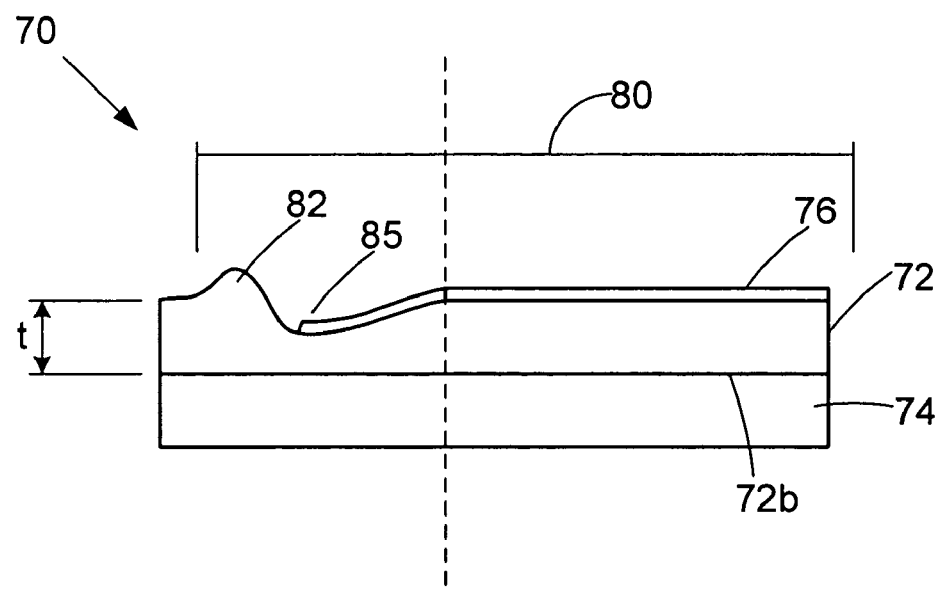
FIG. 1H illustrates the transducer of FIG. 1G after deflection.

FIG. 1H illustrates transducer 70 after actuation using electrodes 74 and 76 and deflection of a portion of polymer 72. Rigid electrode 76 prevents the bottom surface 72b of polymer 72 from deflecting. In this case, only a portion of polymer 72 deflects and expands in the plane where electrodes 74 and 76 laterally overlap, as shown. After deflection, a polymer surface feature 82 is created above the undeflected thickness 22 after deflection. In addition, only a left portion of compliant electrode 76 is below the undeflected thickness 22 and forms an electrode surface feature 85. The remainder of compliant electrode 76 remains substantially at the same elevation relative to the undeflected thickness 22. Thus, in some cases, it is possible for an electrode to include portions in an active area that contribute to an electrode surface feature and portions outside an active area or electrode surface feature that do not contribute.

In some cases, an electrode may elevate above the undeflected thickness, t. For example, if a second active area were patterned over polymer 72 at polymer surface feature 82, it is possible for this electrode from a second active area to rise above the undeflected thickness 22 for deflection of another portion of the polymer. Thus, the polymer surface feature refers to polymer material above the undeflected thickness after the deflection regardless of whether an electrode has been pattered over the polymer surface feature.

In another embodiment, an electroactive polymer comprises a common electrode. A common electrode is an electrode that is capable of electrically communicating with more than one active area of an electroactive polymer. In many cases, a common electrode allows monolithic transducers to be implemented with less complexity (see FIG. 3C). For example, multiple electrodes may be patterned on one surface of a polymer while the entire second surface includes a common electrode. Alternatively, a common electrode may be used to sequentially actuate multiple active areas according to a propagation of the electrical charge through the common electrode.

3. Passive Layer

For some electroactive polymer transducers, in absolute terms, the change in polymer thickness during deflection or actuation may be small relative to the change in the planar area dimensions. For instance, for a thin polymer film, area changes may be of the order of square centimeters and changes in planar dimensions may be of the order of centimeters, while thickness changes may be of the order of microns (thousandths of a millimeter). However, although the absolute change in thickness for the polymer film in an electroactive polymer device in this instance is small, the percentage change is still significant (e.g., 50% or greater).

Figure 2A:
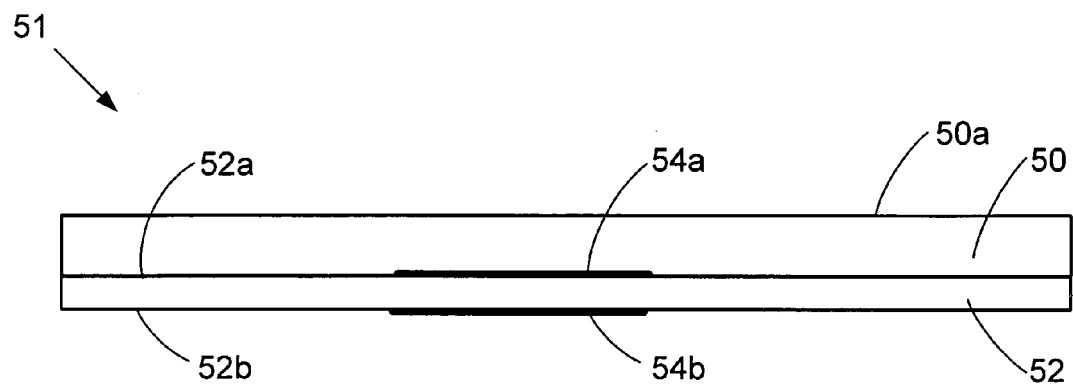
FIG. 2A illustrates a transducer including a passive layer that enhances out-of-plane deflection in accordance with one embodiment of the present invention.
Figure 2B:
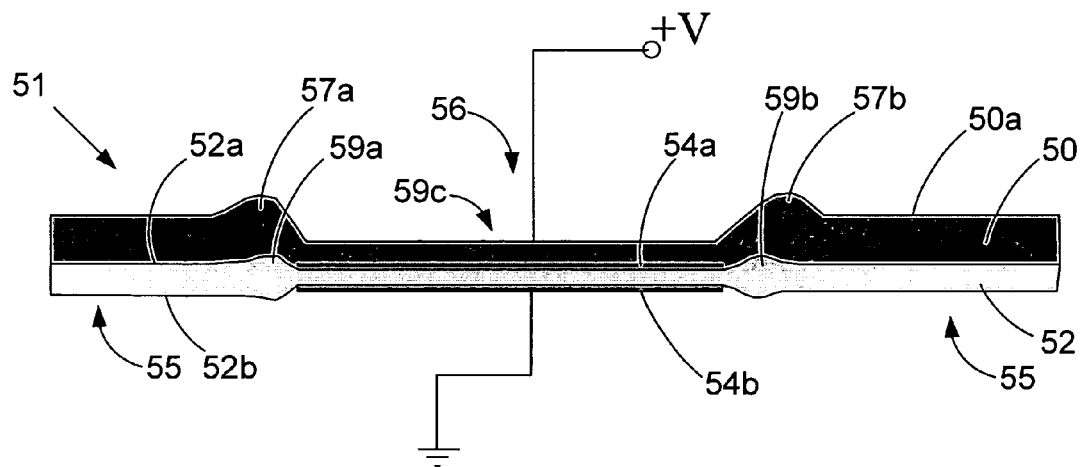
FIG. 2B illustrates the transducer of FIG. 2A in an actuated state.

In one embodiment, transducers and devices of the present invention comprise a passive layer to amplify out-of-plane deformations and create more visible polymer and electrode surface features. FIGS. 2A-2B illustrate an electroactive polymer transducer 51 comprising a passive layer 50 in accordance with one embodiment of the present invention. FIG. 2A illustrates transducer 51 in an undeflected state without polymer deflection. As shown in FIG. 2A, polymer surfaces 52a and 52b and a passive layer surface 50a opposite to polymer 52 are all substantially flat before deflection of polymer 52. FIG. 2B illustrates the transducer 51 in an actuated state. Compliant electrodes 54a and 54b are attached to a central portion 56 of polymer 52 on its top and bottom surfaces 52a and 52b, respectively. For actuation, an electric field with a voltage, V, is applied via electrodes 54 across polymer 52 to actuate a portion 56 of polymer 52.

Passive layer 50 neighbors top surface 52a of polymer 52 and is configured to deflect with deflection of the electroactive polymer such that a surface 50a of passive layer 50 opposite to electroactive polymer 52 forms a set of passive layer surface features 57 that resembles the set of surface features 59 on top surface 52a of polymer 52. Passive layer 50 is passive in that it conforms in cross sectional shape and dimensions to the forces applied onto it by polymer 52. In another embodiment, passive layer 50 may also be considered passive relative to the electroactive polymer 52 in that it does not respond to the application of an electric field, with an area change and thickness change, like polymer 52.

For transducer 51, passive layer 50 couples directly to electroactive polymer 52 such that changes in polymer 52 surface area and thickness during actuation at least partially transfer to passive layer 50. When passive layer 50 couples to electroactive polymer 52, surface area and thickness changes in electroactive polymer 52 induce shearing forces in passive layer 50 that change the surface area and thickness of passive layer 50. Since passive layer 50 is thicker than polymer 52, or at least increases the combined thickness of passive layer 50 and polymer 52, a change in surface area and thickness in passive layer 50 may be used to amplify, in absolute terms, a displacement produced by the change in thickness of polymer 52.

In one embodiment, passive layer 50 contacts polymer 52 and coupling between passive layer 50 and polymer 52 may include direct attachment, an adhesive, or bonding of passive layer 50 onto polymer 52 (or portion thereof), etc. Alternatively, each passive layer 50 may be applied to electroactive polymer 52 as a surface coating. In another embodiment, passive layer 50 does not contact polymer 52 and one or more intermediate rigid structures are disposed between passive layer 50 and polymer 52. The rigid structures, such as metal posts, attach to both passive layer 50 and polymer 52 and are configured to transfer forces from the electroactive polymer to passive layer 50. The intermediate rigid structures then mechanically couple passive layer 50 and polymer 52 and transmit forces upon polymer 52 deflection.

In the cross section shown in FIG. 2B, elevated passive layer surface features 57a and 57b are created around the edges of top electrode 54a corresponding to the displaced top and elevated polymer surface features 59a and 59b, respectively, at the edges of top electrode 54a. Passive layer surface features 57a and 57b generally result in passive layer 50 from the fact that while the passive layer 50 increases in area over portion 56 corresponding to the shape of electrodes 54a and 54b and active area created by electrodes 54, passive layer 50 typically (depending on design) decreases in area over the inactive regions 55 of polymer 52 outside the electrodes 45 and active area. Since passive layer 50 generally keeps a substantially constant total volume (with the exception when passive layer 50 includes a compressible foam), if its surface area decreases during actuation or polymer deflection in the inactive regions, then the passive layer 50 thickness typically increases and forms the surface features 57. The location of thickness increase and surface features is typically predictable based on stress build up in the passive layer 50. In many cases, the thickness increase is enhanced in regions of high strain, such as those immediately bordering the electrodes 54 and active area of transducer 51.

In this manner, passive layer 50 forms a set of passive layer surface features 57 that resembles the set of surface features 59 on the top surface of polymer 52. The set of surface features 59 on the top surface of polymer 52 includes both elevated polymer surface features and depressed electrode surface features. Thus, a set of passive layer surface features 57 may include both elevated and depressed portions relative to the original thickness of passive layer 50. For transducer 51, the set of passive layer surface features 57 includes elevated portions 57a and 57b corresponding to top polymer surface features 59a and 59b and a depressed potion 57c corresponding to thinning of polymer 52 in central portion 56. It is understood that passive layer surface features 57 may not exactly mimic the spatial arrangement and size of polymer surface features and recessed electrode surface features on polymer 52 and may include spatial offsets, relative variations and minor quantitative differences. In general, however, the set of passive layer surface features 57 resembles the set of surface features 59 on the top surface of polymer 52 in approximate spatial configuration, relative size, etc. The number of surface features 57 for passive layer 50 will generally correspond to the number of surface features 59 on the top surface of polymer 52, and each set may include from 1 to 200 surface features, or more, depending on the number, complexity and layout of electrodes on polymer 52.

Figure 2C:
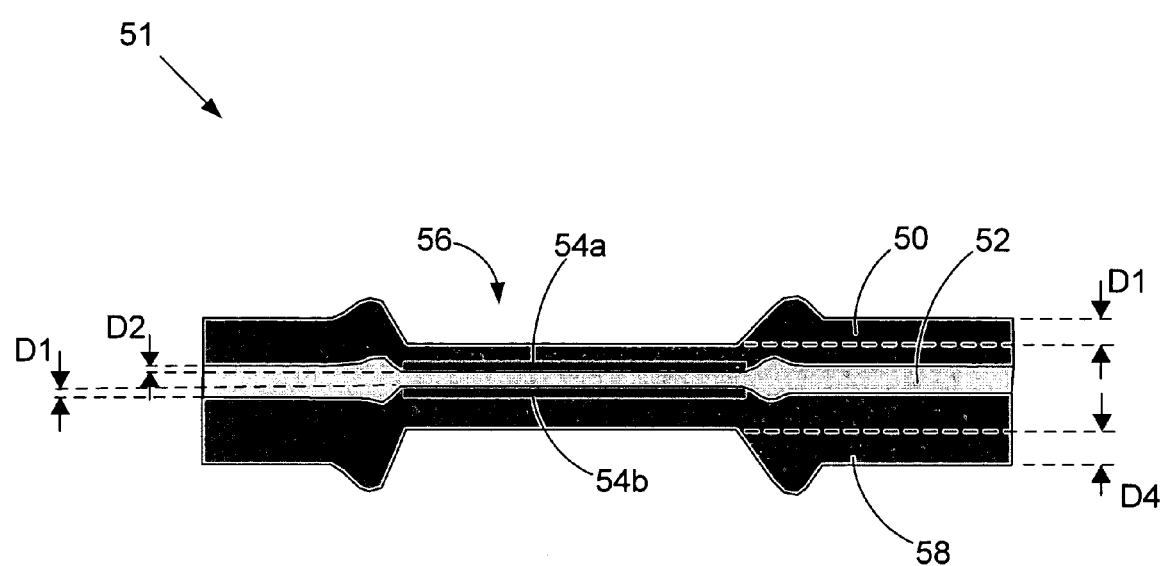
FIG. 2C illustrates a transducer comprising an electroactive polymer between two passive layers in accordance with a specific embodiment of the present invention.

FIG. 2C illustrates a transducer 51 comprising an electroactive polymer 52 between two passive layers 50 and 58 in accordance with a specific embodiment of the present invention.

Actuation of polymer 52 in portion 56 via electrodes 54 causes polymer 52 in portion 56 to increase in planar area and reduce in thickness. Correspondingly, when portion 56 of polymer 52 is actuated, the passive layers 50 and 58 in this surface region both increase in area. Actuation of polymer 52 thus causes top and bottom passive layers 50 and 58 to reduce in thickness about portion 56 in the area where polymer 52 thickness has contracted. The reduction in thicknesses of the top passive layer 50 and the bottom layer 58 are distances, D1 and D4, respectively, as measured from their thickness. The change in thickness of polymer 52 at its contact with the top passive layer 50 and the bottom passive layer 58 are, D2 and D3, respectively. Top and bottom passive layers 50 and 58 are each thicker than polymer 52. Hence, the change in thickness of top and bottom passive layers 50 and 58 is greater than the change in thickness of polymer 52 in portion 56, i.e., D1>D2 and D4>D3. In this manner, each passive layer 50 and 58 amplifies the absolute displacement (change in thickness) as compared to an electroactive polymer transducer without passive layers.

The magnitude of forces generated by actuation of portion 56 in polymer 52 limits the thickness and stiffness of each passive layer 50. As one of skill in the art will appreciate, the amount of forces generated by actuation of portion 56 is affected by the size of portion 56, polymer 52 material, dielectric constant, and actuation voltage, for example. As the thickness or stiffness of each passive layer 50 increases, the required shear forces to displace it also increases. Thus, as the thickness for passive layer 50 increases, deflection of passive layer 50 decreases for a constant force from the polymer. Also, if passive layer 50 is relatively compliant but thick, then actuation of portion 56 may still displace the passive layer but the resulting thickness change in passive layer 50 and definition of passive layer surface features may be smoothed out and not have sharp edge definition relative to portion 56.

The stiffness of the passive layers 50 and 58 may thus be selected depending on a desired absolute displacement. In one embodiment, passive layer 50 comprises a modulus of elasticity less than a modulus of elasticity for electroactive polymer 52. This reduces the elastic resistance provided by passive layer 50 onto transducer 51 and increases the magnitude and definition of passive layer surface features for a given electrical input. In another embodiment, passive layer 50 comprises a modulus of elasticity less than one tenth than the modulus of elasticity for electroactive polymer 52.

The thickness of the passive layers 50 and 58 may also be selected depending on a desired absolute displacement. In one embodiment, passive layer 50 comprises a thickness greater than a thickness for electroactive polymer 52. This increases visual output of surface features produced by actuation of portion 56. In another embodiment, passive layer 50 comprises a thickness greater than double the thickness for polymer 52.

Multiple layers the polymer (plus electrodes) and/or the passive layers may also be employed. This also allows actuation of surface features on top of other surface features, e.g., one layer actuates a broad bowl shape and another layer actuates a small bump within the bowl.

In general, passive layer 50 may comprise any material suitable for amplifying the vertical profile and/or visibility of surface features in electroactive polymer 52. Exemplary passive layer 50 materials include silicone, a soft polymer, a soft elastomer (gel), a soft polymer foam, or a polymer/gel hybrid, for example. The material used in passive layer 50 may be selected for compatibility with a particular electroactive polymer 52, depending on such parameters as the modulus of elasticity of polymer 52 and the thickness of passive layer 50. In a specific embodiment, passive layer 50 comprises a compressible foam including a non-linear elastic modulus with strain of the passive layer. In this case, elastic response of passive layer 50 not linear and thus provides varying output (gets thinner or thicker at varying rates) based on the non-linear stress/strain curve.

Deflections, surface features and thickness changes for top and bottom layers 50 and 58 may be asymmetric. As shown in FIG. 2B, top layer 50 includes a smaller thickness change than bottom layer 58. Displacement asymmetry may be achieved via several techniques, such as using different materials with different stiffness for the top and bottom passive layers 50 and 58, using the same passive layer material but with different thicknesses for the top and bottom layers 50 and 58, by placing different pre-strains on the top and bottom layer, combinations of the above techniques, etc. Alternatively, using substantially identical materials and similar actuation conditions between top and bottom passive layers 50 and 58 may generate substantially symmetrical displacements for top and bottom passive layers 50 and 58.

In some cases, larger or more defined surface features 57 may be desirable and methods may be implemented to increase the height of surface features 57. For example, the thickness of passive layer 50 may be increased, more layers may be added or used, electrode 54 geometry changed, polymer 52 geometry changed, passive layer 50 geometry or material changed, or the distribution of charge across electrodes 54 changed to increase the height of surface features 57. Alternatively, if desired, surface features 57*a* and 57*b* may be reduced in height by such methods as placing passive layer 50 under strain, by using a surface coating on passive layer 50, by changing electrode 54 geometry, changing polymer 52 geometry, changing passive layer 50 geometry, or by changing the distribution of charge across electrodes 54.

4. Geometric Surface Feature Examples

Transducers of the present invention may create wide variability in a set of surface features—both in number and specific shape or geometry for individual features. The surface features may include one or more elevated surface features based on polymer deformation out of the polymer plane and/or one or more lowered surface features based on the electrode and polymer thinning about an active area. Described below are several illustrative examples.

Figure 3A:
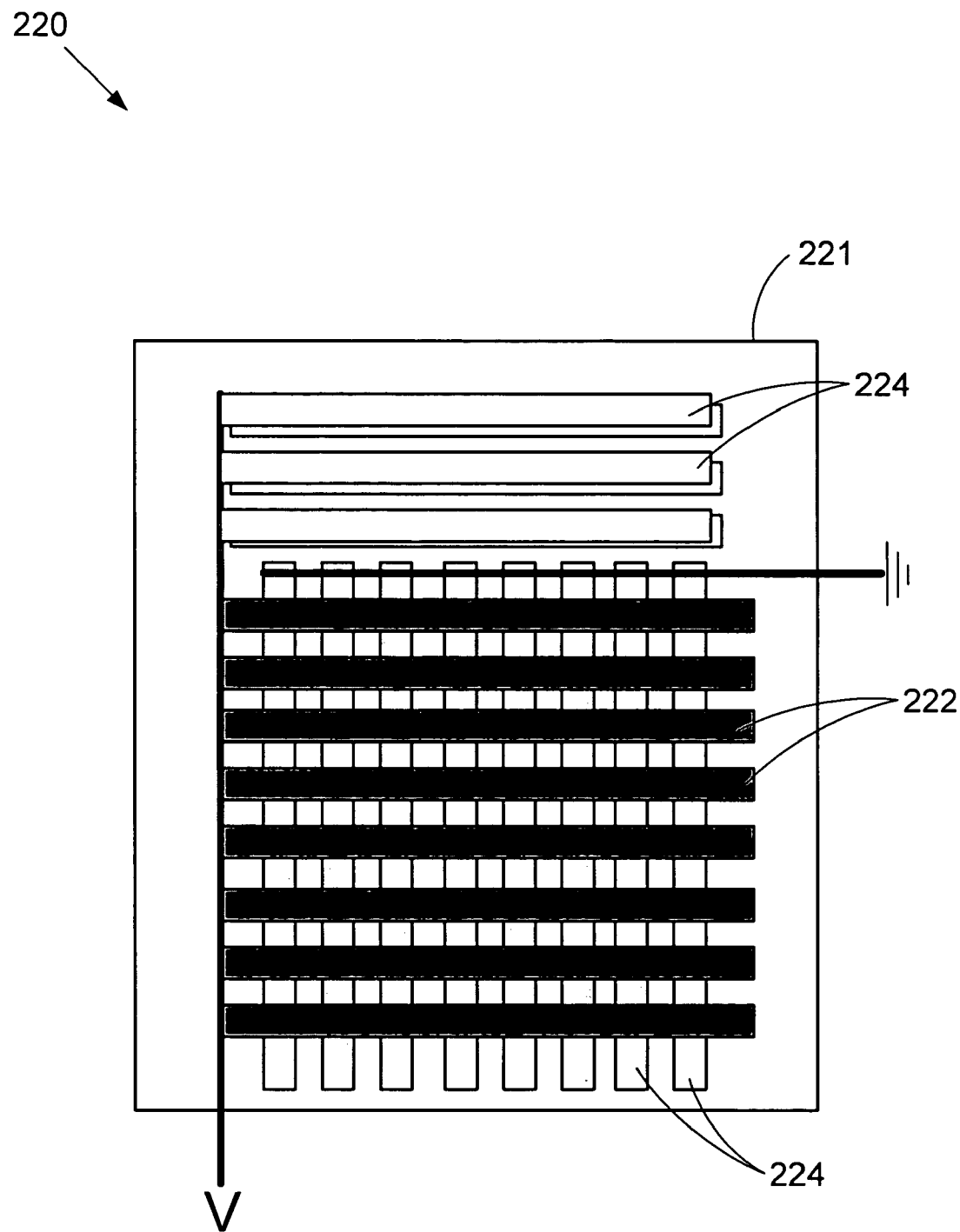
FIG. 3A shows a top elevated view of crossing common electrodes for a transducer in accordance with a specific embodiment of the present invention.

FIG. 3A shows a top elevated view of crossing common electrodes for a transducer 220 in accordance with a specific embodiment of the present invention. In this case, a set of horizontal top surface common electrodes 222 are linked together and disposed on the top surface of a transparent electroactive polymer 221. In addition, a set of vertical bottom surface common electrodes 224 are linked together and disposed on the bottom surface of transparent electroactive polymer 221. Top surface electrodes 222 may be activated commonly, as can bottom surface electrodes 224.

Figure 3B:
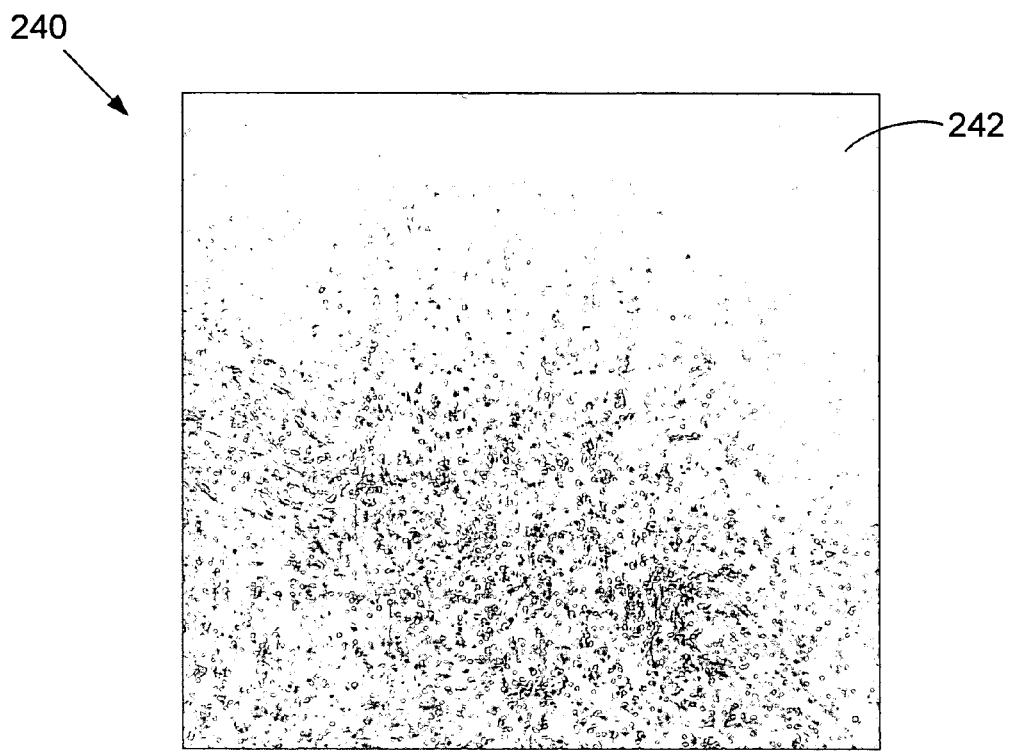
FIGS. 3B-3C show top elevated photos for a transducer including a passive layer in accordance with another specific embodiment of the present invention.
Figure 3C:
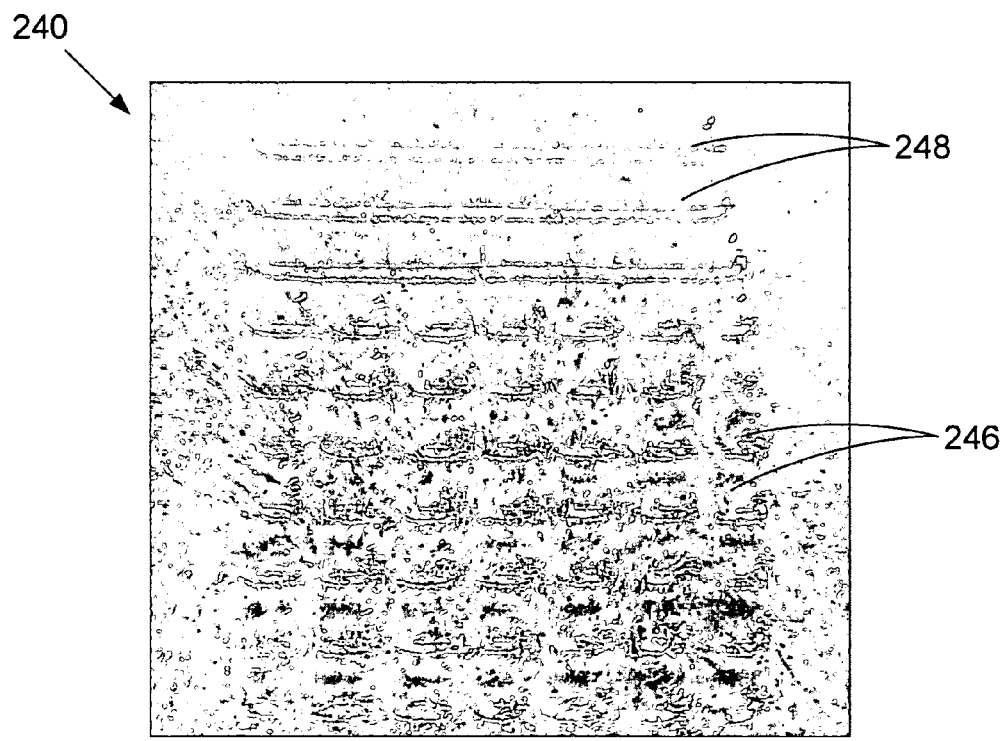

FIGS. 3B-3C show top elevated photo of actuation patterns for a transducer 240 in accordance with another specific embodiment of the present invention. Transducer 240 includes a passive layer 242 disposed over a top surface of an electroactive polymer (not shown). The passive layer 242 enhances thickness changes in the polymer and visualization of surface features on the surface of passive layer 242. In FIG.

3B, a voltage is not applied to the electroactive polymer and the surface of the passive layer 242 is essentially smooth and substantially flat. In FIG. 3C, voltage is applied to common electrodes and a set of depressed square surface features 246 are created. Also shown is a set of three depressed parallel line surface features 248 above the set of square surface features 246.

Displacements may also be asymmetric across a passive layer. For instance, an electroactive polymer may include a plurality of active areas coated with a passive layer where the displacements may vary from one active area to another active area across the layer based on varying passive layer thicknesses for the different active areas.

Figure 3D:
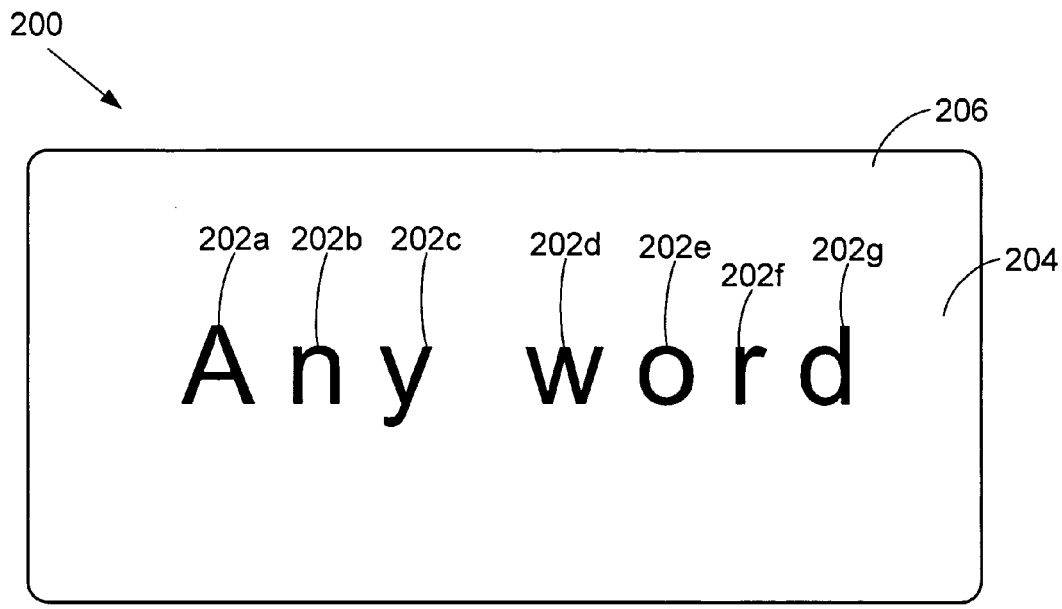
FIG. 3D illustrates a top elevated view of a transducer in accordance with a specific embodiment of the present invention.

In one embodiment, one or more electrodes are patterned or configured in surface area to affect a surface shape and appearance for a surface feature. FIG. 3D illustrates a top elevated view of a transducer 200 in accordance with a specific embodiment of the present invention (without a passive layer). Transducer 200 comprises electrodes 202a-g disposed on a top surface 204 of electroactive polymer 206 and a common electrode disposed on the bottom side (not shown). Each electrode 202a-g resembles a letter, as shown.

Figure 3E:
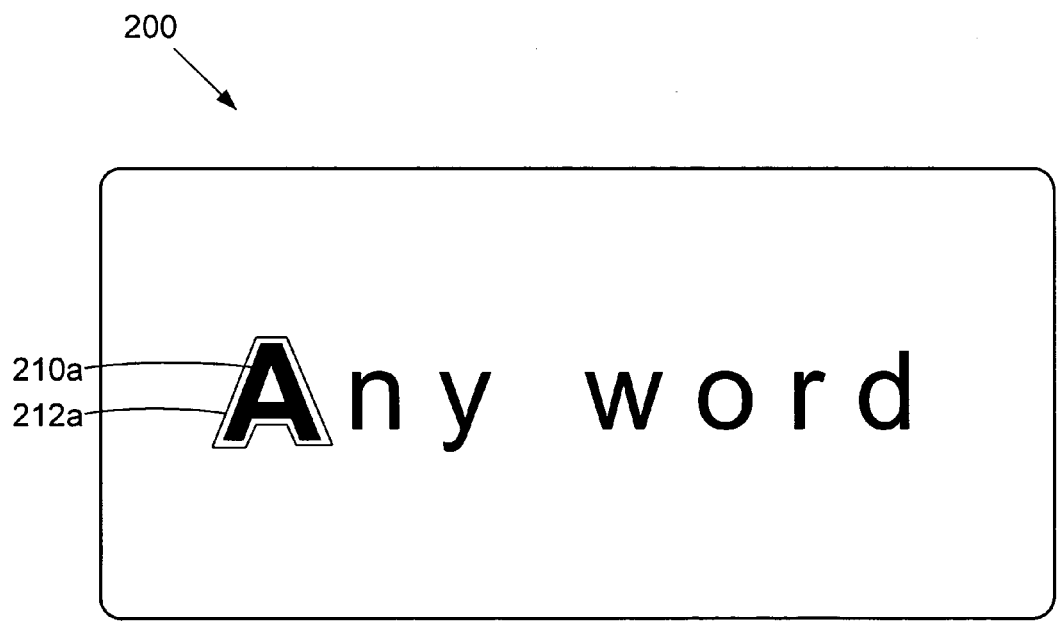
FIG. 3E illustrates a top elevated view of the transducer of FIG. 3D with actuation of a letter.

Actuation of an active area corresponding to each electrode 202a-g causes surfaces features 210 on surface 204 to become visible. FIG. 3E illustrates actuation of one letter. More specifically, actuation of an active area corresponding to electrode 202a causes the letter 'a' to increase in planar size and depress into polymer 206 corresponding to the thinning of polymer 206, thus creating an electrode surface feature 210a below the polymer thickness. In addition, actuation of an active area corresponding to electrode 202a causes the letter 'a'-shaped electrode 202a to increase in planar size and forces polymer 206 bordering the expanded electrode 202a to elevate and create a ridge polymer surface feature 212a about the electrode 202a. Electrode 202a is thus configured in surface area to affect a surface shape for recessed electrode surface feature 210a and elevated surface feature 212a.

Electrodes 202a-g and their corresponding active areas and surfaces features may be independently controlled. Thus, in conjunction with suitable control electronics, electrodes 202a-c and their respective active areas and surface features may be actuated simultaneously to create polymer surface features that spell a word. Other letters may be patterned to create customized visual words and outputs.

The present invention is not limited to simple square or rectangular geometric shapes. Other shapes (circles, triangles, etc.) or complex patterns may be generated with the present invention. For instance, electrodes may be patterned for logos, line drawings, etc. In another embodiment the squares of FIG. 3A may be individually patterned and controlled to generate different surface feature outputs.

Figure 3F:
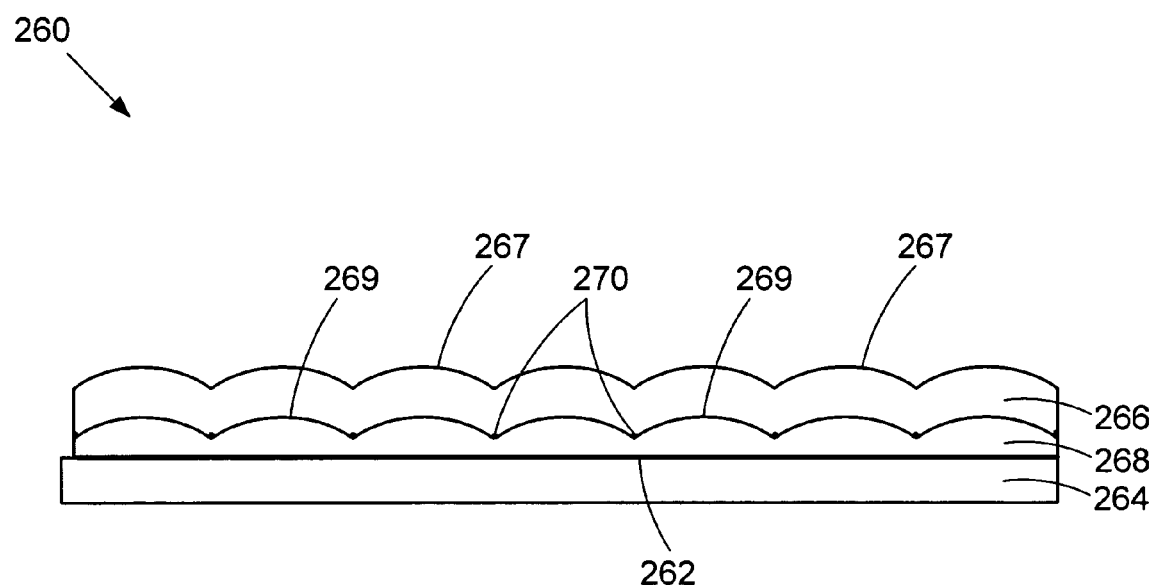
FIG. 3F illustrates a side view of grid surface features electrodes for a transducer in accordance with another specific embodiment of the present invention.

FIG. 3F illustrates a side view of grid surface features for a transducer 260 in accordance with another specific embodiment of the present invention. A non-compliant electrode 262 is mounted to a rigid structure 264. A passive layer 266 is mounted on top surface of polymer 268. On a top surface of polymer 268 is a grid of thin conductive strips 270, such as a metal wires. When polymer 268 is actuated, the conductive wires 270 cut into polymer 268 causing polymer 268 to bulge around the wires 270. Bulging surface polymer features 269 in polymer 268 cause corresponding bulging surface features 267 in passive layer 266. For instance, in one embodiment, the metal wires 270 are laid out in a grid in a diamond pattern like a quilt and when the polymer 268 is actuated the passive layer 266 exhibits a quilted pattern on the surface of passive layer 266.

5. Multifunctionality

Electroactive polymers may convert between electrical energy and mechanical energy in a bi-directional manner. Sensing electrical properties of an electroactive polymer transducer also permits sensing functionality.

FIGS. 1A and 1B may be used to show one manner in which the transducer portion 10 converts mechanical energy to electrical energy. For example, if the transducer portion 10 is mechanically stretched by external forces to a thinner, larger area shape such as that shown in FIG. 1B, and a relatively small voltage difference (less than that necessary to actuate the film to the configuration in FIG. 1B) is applied between electrodes 14 and 16, the transducer portion 10 will contract in area between the electrodes to a shape such as in FIG. 1A when the external forces are removed. Stretching the transducer refers to deflecting the transducer from its original resting position—typically to result in a larger net area between the electrodes, e.g. in the plane defined by directions 18 and 20 between the electrodes. The resting position refers to the position of the transducer portion 10 having no external electrical or mechanical input and may comprise any pre-strain in the polymer. Once the transducer portion 10 is stretched, the relatively small voltage difference is provided such that the resulting electrostatic forces are insufficient to balance the elastic restoring forces of the stretch. The transducer portion 10 therefore contracts, and it becomes thicker and has a smaller planar area in the plane defined by directions 18 and 20 (orthogonal to the thickness between electrodes). When polymer 12 becomes thicker, it separates electrodes 14 and 16 and their corresponding unlike charges, thus raising the electrical energy and voltage of the charge. Further, when electrodes 14 and 16 contract to a smaller area, like charges within each electrode compress, also raising the electrical energy and voltage of the charge. Thus, with different charges on electrodes 14 and 16, contraction from a shape such as that shown in FIG. 1B to one such as that shown in FIG. 1A raises the electrical energy of the charge. That is, mechanical deflection is being turned into electrical energy and the transducer portion 10 is acting as a generator.

In some cases, the transducer portion 10 may be described electrically as a variable capacitor. The capacitance decreases for the shape change going from that shown in FIG. 1B to that shown in FIG. 1A. Typically, the voltage difference between electrodes 14 and 16 will be raised by contraction. This is normally the case, for example, if additional charge is not added or subtracted from electrodes 14 and 16 during the contraction process. The increase in electrical energy, U, may be illustrated by the formula $U = 0.5\ Q^2/C$, where Q is the amount of positive charge on the positive electrode and C is the variable capacitance which relates to the intrinsic dielectric properties of polymer 12 and its geometry. If Q is fixed and C decreases, then the electrical energy U increases. The increase in electrical energy and voltage can be recovered or used in a suitable device or electronic circuit in electrical communication with electrodes 14 and 16. In addition, the transducer portion 10 may be mechanically coupled to a mechanical input that deflects the polymer and provides mechanical energy.

Electroactive polymers of the present invention may also be configured as a sensor. Generally, an electroactive polymer sensor detects a "parameter" and/or changes in the parameter. The parameter is usually a physical property of an object such as strain, deformation, velocity, location, contact, acceleration, vibration, pressure, size, etc. In some cases, the parameter being sensed is associated with a physical "event". The physical event that is detected may be the attainment of a particular value or state for example. An electroactive polymer sensor is configured such that a portion of the electroactive polymer deflects in response to the change in a parameter being sensed. The electrical energy state and deflection state of the polymer are related. The change in electrical energy or a change in the electrical impedance of an active area resulting from the deflection may then be detected by sensing electronics in electrical communication with the active area electrodes. This change may comprise a capacitance change of the polymer, a resistance change of the polymer, and/or resistance change of the electrodes, or a combination thereof. Electronic circuits in electrical communication with electrodes detect the electrical property change. If a change in capacitance or resistance of the transducer is being measured for example, one applies electrical energy to electrodes included in the transducer and observes a change in the electrical parameters.

For ease of understanding, the present invention is mainly described and shown by focusing on a single direction of energy conversion. More specifically, the present invention focuses on converting electrical energy to mechanical energy. However, in all the figures and discussions for the present invention, it is important to note that the polymers and devices may convert between electrical energy and mechanical energy bi-directionally. Thus, any of the exemplary transducers described herein may be used with a generator or sensor. Typically, a generator of the present invention comprises a polymer arranged in a manner that causes a change in electric field in response to deflection of a portion of the polymer. The change in electric field, along with changes in the polymer dimension in the direction of the field, produces a change in voltage, and hence a change in electrical energy.

As the terms are used herein, a transducer refers to an electroactive polymer with at least two electrodes; an electroactive polymer device refers to a transducer with at least one additional mechanical coupling or component; an electroactive polymer actuator refers to a transducer or device configured to produce mechanical output of some form; an electroactive polymer generator refers to a transducer or device configured to produce electrical energy; and an electroactive polymer sensor refers to a transducer or device configured to sense a property or event.

Thus, polymers and transducers of the present invention may be used as an actuator to convert from electrical to mechanical energy, a generator to convert from mechanical to electrical energy, a sensor to detect changes in the mechanical or electrical state of the polymer, or combinations thereof. Mechanical energy may be applied to a transducer in a manner that allows electrical energy to be removed or electrical changes to be sensed. Many methods for applying mechanical energy, removing electrical energy and sensing electrical changes from the transducer are possible. Actuation, generation and sensing devices may require conditioning electronics of some type. For instance, at the very least, a minimum amount of circuitry is needed to apply or remove electrical energy from the transducer. Further, as another example, circuitry of varying degrees of complexity may be used to sense electrical states of a sensing transducer.

In one embodiment, an electroactive polymer transducer active area may be electrically controlled via suitable electronic control (e.g., a processor configured to control an active area) to provide a variable surface feature height and displacement depth in a passive layer that varies with time. For instance, a microprocessor that controls the actuation of electroactive polymer transducer may be connected to a sensor. The displacement depth may be varied in time by the microprocessor according to measurements taken by the sensor.

6. Methods of Use

Figure 4:
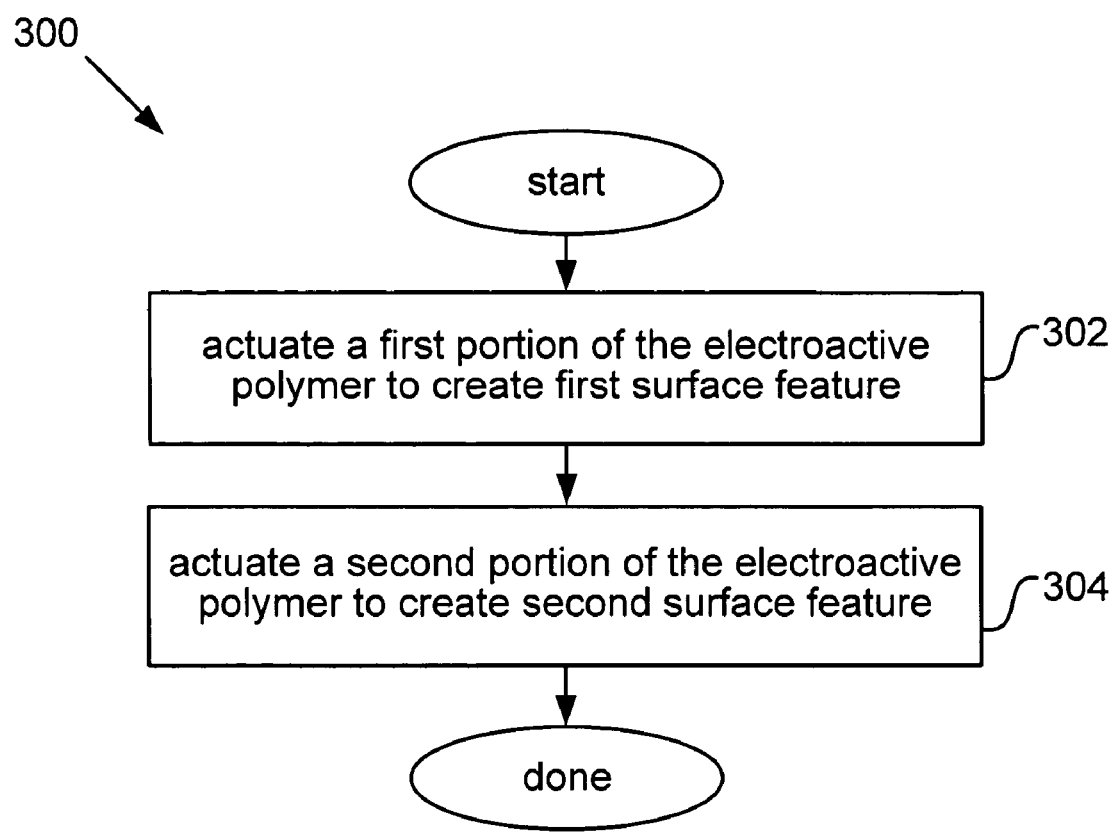
FIG. 4 illustrates a process flow for using an electroactive polymer transducer in accordance with one embodiment of the present invention.

The present invention also incorporates methods of using an electroactive polymer transducer. FIG. 4 illustrates a process flow 300 for using an electroactive polymer transducer in accordance with one embodiment of the present invention. While electroactive polymer transducers will now be described as a method, those skilled in the area will recognize that the present invention encompasses a transducers and devices capable of performing the actions as described below.

Process flow 306 begins by actuating a first portion of the electroactive polymer (302). The first portion includes an undeflected thickness for a first surface region on a first surface of the polymer before actuation of the first portion. Actuation creates a first surface feature on the first surface. The surface feature may comprise a polymer surface feature that elevates above the undeflected thickness after the actuation or an electrode portion below the undeflected thickness for the firs surface region after the deflection. Exemplary feature shapes and arrangements are described above.

Process flow 300 proceeds by actuating a second portion of the electroactive polymer (304). The second portion includes an undeflected thickness for a second surface region on the first surface of the polymer. The second actuation creates a second surface feature on the first surface. In one embodiment, the first and second portions are actuated simultaneously. In another embodiment, the second portion actuates after the first portion.

Figure 5A:
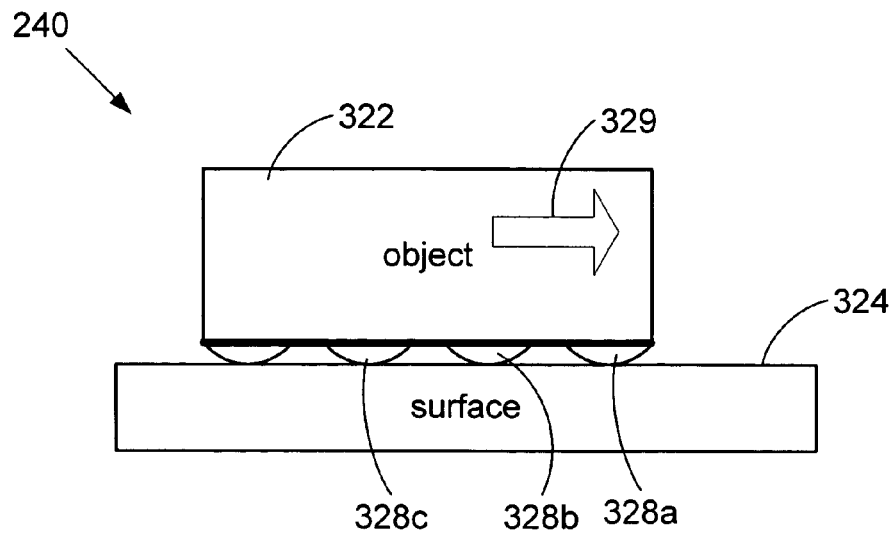
FIG. 5A illustrates a method for moving two objects relative to each other using stepwise deflection of multiple active areas in accordance with a specific embodiment.

FIG. 5A illustrates a method for moving two objects relative to each other using stepwise deflection of multiple active areas in accordance with a specific embodiment. An object 322 is shown sliding over a surface 324. A surface deforming electroactive polymer transducer 326 attaches to the bottom of object 322. Actuation of an active area 328 on transducer 326 pushes object 322 from surface 324 and tilts object 322. Sequentially ctuating active areas 328a, 328b, and 328c pushes object 322 forward along surface 324 in direction 329. Thus, transducer 326 is used to drive traveling waves across the interface that push object 322 across surface 324. In another embodiment, the surface deforming transducer 326 attaches to surface 324 and acts as a conveyor on surface 324 to move objects on the surface.

7. Applications

A few additional exemplary applications will now be described. These applications are provided for illustrative purposes and are not meant to the limit the application of transducers and devices described herein in any way. Electroactive polymer transducers and devices described herein are very scalable. Thus, transducers and devices of the present invention may be used in both macroscopic applications, such as speakers, or in microscopic applications, such as an actuator fabricated on a semi-conductor device.

Creation of letters as described above is well suited for used in reconfigurable displays. For example, a dashboard in a car may include a surface deforming electroactive polymer transducer that includes multiple states. One state might be clean in which little or no surface features are visible. Upon initiation by a user, various menus and controls are then created on the dashboard. Combing the sensing ability of the polymers allows a driver or passenger to input commands and interface with a processor or affect one or more controlled systems in the car. The dashboard surface features may include letters, logos, symbols and other features related to control of systems in a car such as climate control, an audio system, a navigation system, etc. Other than dashboards, such reconfigurable actuators and sensors are useful to produce calculators, keyboards, handheld electronics devices, etc.

In one embodiment, surface deformation transducers and devices may be used for sound generation applications, such as speakers. Further description of sound generation using a an electroactive polymer is described in U.S. Pat. No. 6,343,129, which is incorporated herein in its entirety and for all the purposes.

In another embodiment, a surface deforming electroactive polymer transducer device may be actuated to increase or decrease the friction coefficient between an object and a surface. In one embodiment, the surface deforming transducer device may be mounted across the bottom of the object an actuated in a manner to provide a variable coefficient of friction across the bottom of the object. The variable coefficient of friction may be used to generate frictional steering. One application where friction control may be applied is on the bottom of skis or snowboards. The friction control may be used for aiding in the braking or turning of the skis or snowboard.

Figure 5B:
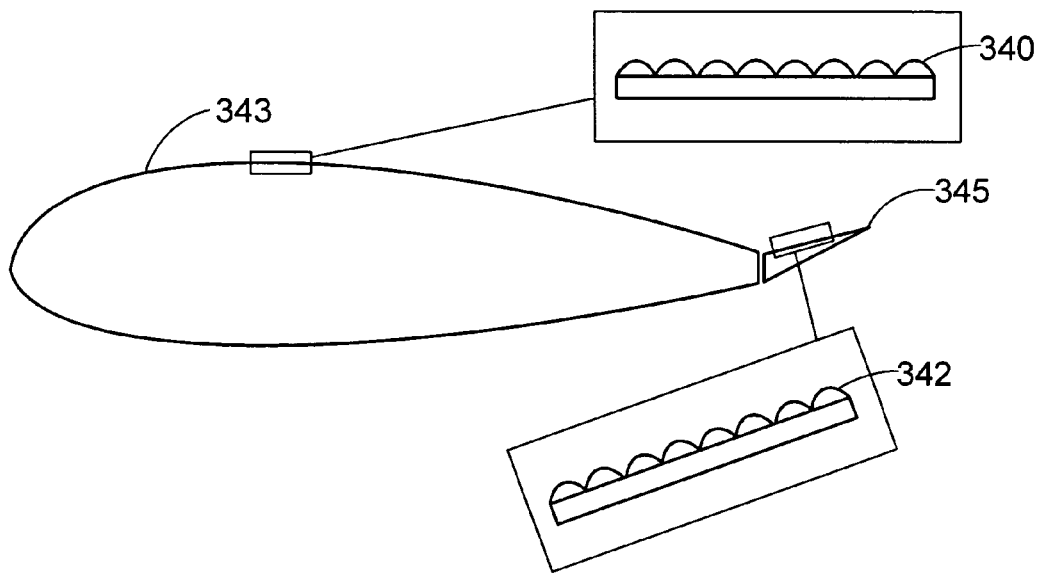
FIG. 5B illustrates surface deforming electroactive polymer transducers mounted to a surface of a wing and a flap in accordance with a specific embodiment of the present invention.

FIG. 5B illustrates surface deforming electroactive polymer transducers 340 and 342 mounted to a surface of a wing 343 and a flap 345, respectively, in accordance with a specific embodiment of the present invention. The actuation of transducers 340 and 342 changes a property of airflow over the wing 343 and flap 345. For instance, active areas on transducer 340 may be actuated to increase or decrease lift and drag on the wing depending on the operating conditions of the wing, e.g., actuated to increase surface roughness and turbulence of airflow passing thereover. In other embodiments, the actuation of transducers 340 and 342 may be used to change the radar cross-sectional properties of the wing surface.

Other exemplary applications for surface deforming electroactive polymer transducers include 1) Braille devices, 2) touch sensitive devices, such as key boards or other interfaces, where the surface deforming transducers are actuated to provide tactile feedback, 3) massagers, 4) vibration devices, 5) pumps and 6) linear actuators. In the Braille device, the surface deforming transducers may be used to create a surface texture that is readable by touch as Braille. In another related application, surface deforming transducers may be used in a 3-D topography display where the surface texture is representative of surface topography of a geographic region.

In one specific embodiment, a transducer with a passive layer on each opposing surface is sandwiched between two rigid conductive layers, such as two metal layers, to generate a variable capacitance capacitor. By actuating the polymer and the passive layers to vary the distance between the two metal layers, the capacitance of the capacitor may be varied when the metal layers are charged.

Changing the texture of a surface is also desirable in military applications such as 'active' military camouflage materials that alter their reflectance.

In one embodiment, actuators and transducers of the present invention are employed for performing thermodynamic work on a fluid in a fluid system or controlling a fluid. Fluid systems are ubiquitous. The automotive industry, plumbing industry, chemical processing industry and aerospace industry are a few examples where fluid systems are widely used. In fluid systems, it is often desirable to control properties of a fluid flow in the fluid system to improve a performance or efficiency of the fluid system or to control the fluid in the fluid system in manner that allows the fluid system to operate for a specific purpose. One method of control of a fluid is through control of a fluid-surface interface. The present invention may then include devices and methods for controlling a fluid surface interface using one or more electroactive polymer actuator devices and surface interfaces. In a specific embodiment, surface deforming transducers are mounted to an inner surface of a fluid conduit. The surface deforming transducers may be actuated to generate wave patterns in the conduit. For instance, the wave patterns may be used to promote mixing. Alternatively, the surface deforming transducers may be actuated to reduce friction in the conduit.

In another specific application, a passive layer connects to a mechanical output or linkage so that thickness displacements generated by a polymer are transferred to the linkage. Deflection of the polymer then controls a state for the mechanical output, namely, the mechanical output has a first state before deflection and a second state after deflection. For example, a surface deforming transducer (or portion thereof) may be used to control a position of the mechanical output or an object that is connected to the mechanical linkage. Alternatively, a surface deforming transducer (or portion thereof) may be used to control a shape of the mechanical output. For example, the mechanical output may include a mirrored surface that is disposed on the passive layer and deflection of the polymer is used to change the shape or position of the mirror to vary light reflected by the mirror.

8. Conclusion

While this invention has been described in terms of several preferred embodiments, there are alterations, permutations, and equivalents that fall within the scope of this invention which have been omitted for brevity's sake. By way of example, although the present invention has been described in terms of several polymer materials and geometries, the present invention is not limited to these materials and geometries. It is therefore intended that the scope of the invention should be determined with reference to the appended claims.

What is claimed is:

1. An electroactive polymer transducer, the transducer comprising:
    an electroactive polymer including an undeflected thickness for a surface region on a first surface of the polymer;
    a first electrode disposed on a portion of the first surface of the electroactive polymer;
    a second electrode disposed on a portion of a second surface of the electroactive polymer; and
    wherein the electroactive polymer is configured to include a polymer surface feature above the undeflected thickness after deflection of an active area and the first electrode is configured to include an electrode surface feature below the undeflected thickness after deflection of the active area.

2. The transducer of claim 1 wherein the polymer surface feature is outside the first electrode on the first surface.

3. The transducer of claim 2 wherein the first electrode or the second electrode is a common electrode.

4. The transducer of claim 1 further comprising a third electrode disposed on the first or second surface.

5. The transducer of claim 1 wherein the first electrode or the second electrode comprises a non-compliant electrode.

6. The transducer of claim 5 wherein the first electrode or the second electrode comprises a metal.

7. The transducer of claim 5 wherein the first electrode or second electrode comprises a rigid or semi-flexible electrode.

8. The transducer of claim 1 wherein the first electrode or second electrode comprises a compliant electrode.

9. The transducer of claim 1 wherein the first electrode or second electrode is configured in surface area to affect a surface shape for the polymer surface feature or the electrode surface feature.

10. The transducer of claim 1 wherein the first surface is substantially flat before the deflection.

11. The transducer of claim 1 wherein the polymer surface feature or electrode surface feature resembles a geometric shape.

12. The transducer of claim 1 wherein the polymer surface feature or electrode surface feature resembles a letter.

13. The transducer of claim 12 wherein the first electrode includes a shape on the first surface that resembles the surface shape of the letter.

14. The transducer of claim 1 wherein the transducer is included in one of an actuator or a sensor.

15. The transducer of claim 1 wherein the active area is arranged in a manner which causes a portion of the electroactive polymer to deflect in response to a change in electric field provided by the first and second electrodes.

16. The transducer of claim 1 wherein the active area is arranged in a manner which causes a change in electric field in a portion of the electroactive polymer in response to a deflection applied to the portion.

17. The transducer of claim 1 further comprising a rigid layer attached to the second surface.

18. The transducer of claim 1 wherein the undeflected thickness is measured from the second surface to the first surface.

19. An electroactive polymer transducer, the transducer comprising:
    an electroactive polymer including an undeflected thickness for a surface region on a first surface of the polymer;
    a first electrode disposed on a portion of the first surface of the electroactive polymer;
    a second electrode disposed on a portion of a second surface of the electroactive polymer; and
    wherein the electroactive polymer and first electrode are configured to produce a set of surface features on the first surface after deflection of an active area, the set of features including a) a polymer surface feature that is elevated above the undeflected thickness and outside the first electrode on the first surface or b) an electrode surface feature that is depressed below the undeflected thickness.

20. The transducer of claim 19 wherein the first or second electrode comprises a compliant electrode.

21. The transducer of claim 19 wherein the first electrode or the second electrode comprises a non-compliant electrode.

22. The transducer of claim 21 wherein the first electrode or the second electrode comprises a metal.

23. The transducer of claim 21 wherein the first electrode or second electrode comprises a rigid or semi-flexible electrode.

24. The transducer of claim 19 wherein the surface feature is included in a geometric shape on the first surface.

25. The transducer of claim 19 wherein the first electrode includes a shape on the first surface that contributes to the surface shape of the letter.

26. The transducer of claim 19, incorporated into an electroactive polymer device that further includes:
    a passive layer that neighbors the first surface and is configured to deflect with the deflection of the electroactive polymer such that a surface of the passive layer opposite to the electroactive polymer forms a set of passive layer surface features that resembles the set of surface features on the first surface.

27. The device of claim 26 wherein the passive layer comprises a modulus of elasticity less than a modulus of elasticity for the electroactive polymer.

28. The device of claim 27 wherein the passive layer comprises a modulus of elasticity less than one tenth the electroactive polymer modulus of elasticity.

29. The device of claim 26 wherein the passive layer comprises a thickness greater than a thickness for the electroactive polymer.

30. The device of claim 29 wherein the passive layer comprises a thickness greater than double the thickness for the electroactive polymer.

31. The device of claim 26 wherein the passive layer contacts a substantially flat surface.

32. The device of claim 26 wherein the first surface comprises a substantially flat surface before the deflection.

33. The device of claim 32 further comprising a second passive layer that neighbors the second polymer surface.

34. The device of claim 33 wherein the second passive layer is configured to deflect with deflection of the electroactive polymer such that a surface of the second passive layer opposite to the electroactive polymer forms a second set of passive layer surface features that resembles the electroactive polymer surface features on the second surface.

35. The device of claim 33 wherein the first passive layer and the second passive layer provide asymmetric thickness changes.

36. The device of claim 35 wherein the first passive layer includes a greater thickness or greater stiffness than the second passive layer.

37. The device of claim 26 wherein the passive layer surface opposite to the electroactive polymer is substantially flat before the deflection.

38. The device of claim 26 wherein the passive layer comprises a non-linear elastic modulus with strain of the passive layer.

39. The device of claim 26 further comprising an intermediate structure between the passive layer and the electroactive polymer configured to transfer forces from the electroactive polymer to the passive layer.

40. The device of claim 26 further comprising a mechanical output coupled to the passive layer having a first state before the deflection and a second state after the deflection.

41. The device of claim 40 wherein the first state is a first position and the second state is a second position.

42. The device of claim 40 wherein the first state is a first shape and the second state is a second shape.

43. The device of claim 40 wherein the mechanical output includes a mirrored surface.

44. The device of claim 26 wherein the passive layer comprises the first electrode.

45. The device of claim 26 wherein the at least two electrodes comprises a compliant electrode.

46. The device of claim 26 wherein the passive layer surface feature resembles a geometric shape.

47. The device of claim 26 wherein the set of passive layer surface features resembles a letter.

48. The device of claim 26 wherein the transducer is included in one of an actuator or a sensor.

49. The device of claim 26 further comprising a rigid layer disposed adjacent to the second surface of the electroactive polymer.

50. The device of claim 49 wherein the rigid layer comprises the second electrode.

51. A method of actuating an electroactive polymer transducer, the method comprising:
    actuating a first portion of the electroactive polymer including an undeflected thickness for a first surface region on a first surface of the polymer before actuation of the first portion to create a first surface feature on the first surface; and actuating a second portion of the electroactive polymer including an undeflected thickness for a second surface region on the first surface of the polymer before actuation of the second portion to create a second surface feature on the first surface.

52. The method of claim 51 wherein the first surface feature is outside an electrode used in actuating the first portion of the electroactive polymer.

53. The method of claim 51 wherein the electroactive polymer transducer comprises an electrode surface feature below the undeflected thickness for the first surface region after the deflection.

54. The method of claim 51 wherein the second portion is actuated after the first portion finishes actuation.

55. The method of claim 51 wherein the first surface feature comprises a polymer surface feature above the undeflected thickness after the actuation.

* * * * *